United States Patent
Buznitsky et al.

(10) Patent No.: US 6,993,306 B2
(45) Date of Patent: Jan. 31, 2006

(54) DETERMINATION AND PROCESSING FOR FRACTIONAL-N PROGRAMMING VALUES

(75) Inventors: Mitchell A. Buznitsky, Carlsbad, CA (US); Yuqian Cedric Wong, San Diego, CA (US); Daniel C. Bozich, San Diego, CA (US); Brima B. Ibrahim, Los Angeles, CA (US)

(73) Assignee: Broadcom Corporation, Irvine, CA (US)

( * ) Notice: Subject to any disclaimer, the term of this patent is extended or adjusted under 35 U.S.C. 154(b) by 627 days.

(21) Appl. No.: 10/054,247

(22) Filed: Jan. 22, 2002

(65) Prior Publication Data
US 2003/0143969 A1 Jul. 31, 2003

(51) Int. Cl.
H04B 1/06 (2006.01)
H03D 3/18 (2006.01)

(52) U.S. Cl. .................. 455/259; 455/574; 455/112; 455/76; 375/327; 375/369

(58) Field of Classification Search ............... 455/574, 455/259, 112, 76; 375/369, 327, 376; 331/46; 370/518, 503
See application file for complete search history.

(56) References Cited

U.S. PATENT DOCUMENTS

| | | | | |
|---|---|---|---|---|
| 5,021,754 A | * | 6/1991 | Shepherd et al. | 455/112 |
| 5,126,695 A | * | 6/1992 | Abe | 331/46 |
| 5,844,435 A | * | 12/1998 | Grundvig | 375/369 |
| 6,029,061 A | * | 2/2000 | Kohlschmidt | 455/574 |
| 6,650,880 B1 | * | 11/2003 | Lee et al. | 455/259 |
| 6,744,398 B1 | * | 6/2004 | Pyner et al. | 455/259 |
| 6,747,987 B1 | * | 6/2004 | Meador et al. | 455/76 |
| 6,901,126 B1 | * | 5/2005 | Gu | 375/376 |

* cited by examiner

Primary Examiner—Lana Le
(74) Attorney, Agent, or Firm—Garlick Harrison & Markison LLP; Shayne X. Short

(57) ABSTRACT

Determination and processing for fractional-N programming values. The present invention is operable to receive a clock signal (CLK) and to transform that CLK into a new CLK, when necessary, for use by various circuitries within a system. The present invention is operable to generate two different CLKs for use by a radio frequency (RF) circuitry and a baseband processing circuitry in certain embodiments. The present invention employs a measurement circuitry and to characterize a first CLK and uses a fractional-N synthesizer to perform any necessary processing to generate the one or more CLKs to the other CLKs within the system. The first CLK may be received from an external source or it may be generated internally; in either case, the present invention is able to modify the CLK into another CLK for use by other circuitries within the system or for use by another external device.

55 Claims, 17 Drawing Sheets

DETERMINATION AND PROCESSING FOR FRACTIONAL-N PROGRAMMING VALUES

BACKGROUND

1. Technical Field

The invention relates generally to semiconductor devices; and, more particularly, it relates to semiconductor devices that interface with each other, some of which may operate using different clock signals.

2. Related Art

Those persons having skill in the art of semiconductor devices will appreciate the need for interfacing between the various devices within a system. Oftentimes, these various devices must synchronize their operations with each other. Sometimes, this is performed by operating all devices within a system with common clock (CLK). However, this is sometimes simply not possible. For example, some of the various devices require a different CLK. The CLK may have certain characteristics with respect to frequency, duty cycle, drift, and precision among other characteristics. In certain cases, the various devices require various characteristics for their requisite CLK. The situation can become even more complicated when certain of the devices have sub-portions that operate using different CLKs. For example, some of the components may be more insensitive to a CLK's precision. These differing constraints may present a great difficulty in interfacing the various devices within a system.

There is sometimes even greater difficulty in interfacing the devices given the relatively few available pins on a device. For those approaches that have limited pins, there is even greater difficulty in interfacing the devices given that the desirable real estate between the devices are required to support other functionality. There is little availability to hard wire multiple CLKs to a device in such applications where real estate is at a premium. When there are not a large number of available pins, there is an inability to strap the device externally to the proper CLK.

Further limitations and disadvantages of conventional and traditional systems will become apparent to one of skill in the art through comparison of such systems with the invention as set forth in the remainder of the present application with reference to the drawings.

SUMMARY OF THE INVENTION

Various aspects of the invention can be found in a semiconductor system that employs a measurement circuitry and a fractional-N synthesizer. The present invention provides a manner in which any available, received CLK may be modified to generate the requisite CLKs for the various devices within the system. The present invention is able to deal with both a CLK being one of a discrete number of available frequencies, and the present invention is also operable to deal with a CLK having any arbitrary frequency. The present invention is able to select from among a predetermined number of options to process a known CLK input to transform it into a suitable CLK for use by various circuitries within the system. Before performing any processing of the CLK, the present invention is able to measure the various parameters of the CLK that may include measuring the frequency, phase, and/or precision of the CLK.

Alternatively, the present invention is able to measure and perform any necessary arithmetic on a received CLK having an arbitrary frequency to transform it into a CLK that may be used by the device. For example, when the present invention operates by receiving one CLK from among a finite number of available and expected CLK options, it is then able to employ this 'a priori' information to select from among a predetermined number of finite options to transform that CLK into an appropriate CLK that may be used by the device. In the situation where a received CLK is not within this finite set of available options, then the present invention is still able to perform any necessary processing on the received CLK to transform that CLK into an appropriate CLK that may be used by the device.

The present invention is operable to receive a CLK and to transform that CLK into a new CLK, when necessary, for use by various circuitries within a system. The present invention is operable to generate two different CLKs for use by a radio frequency (RF) circuitry and a baseband processing circuitry in certain embodiments. The present invention employs a measurement circuitry to characterize a first CLK and also uses a fractional-N synthesizer to perform any necessary processing to generate the one or more CLKs to the other CLKs within the system. The first CLK may be received from an external source or it may be generated internally; in either case, the present invention is able to modify the CLK into another CLK for use by other circuitries within the system or for use by another external device.

The present invention presents a solution to the problem that requires that a device receive an external known reference frequency of substantially 32.768 kHz. This reference frequency is typically prevalent in low-power devices. At power-up, the device determines, through decode of external mode select pins, whether it is in an application where it must determine the frequency of the external crystal oscillator. If not, the processor is allowed to start-up normally with the output of the fractional-N synthesizer selected as the main system clock. If the crystal frequency requires measurement, the processor is allowed to start with the crystal frequency used directly as the system clock. Upon start-up the processor can then determine its operating mode. If the system clock is already provided by the fractional-N synthesizer, the processor can immediately begin trying to establish communication with a host device. Otherwise it must engage a measurement circuitry.

The measurement circuitry is designed to fulfill at least two functions. One function is to compare the oscillator frequency with an external reference for the purpose of selecting the correct fractional-N synthesizer programming values. One other function is to measure an internally generated low-power oscillator using the external oscillator frequency as a reference. The circuit need not perform both of these functions simultaneously.

The measurement circuitry is operable to employ a comparison circuitry to measure these two clocks. The comparison circuitry averages over a predetermined number of cycles of a known frequency reference. When the high-frequency counter value is greater than or equal to the min range value or less than or equal to the max range value, the associated oscillator is selected. If the counter value is below the lowest min value or above the highest max value, the measurement is declared invalid and the selection defaults to the strapped setting. When the selection process is complete 20 cycles of the substantially 32.768 kHz clock are counted out to allow the fractional-N synthesizer time (600 $\mu$secs in certain embodiments) to lock at the correct system operating frequency. A reset signal is then applied to an embedded microprocessor, the system clock is gated off to the entire chip, the clock selection is changed to select the output of the fractional-N synthesizer, and the clock is gated on. Each of these steps is performed in order at a different 32.768 KHz clock epoch. This prevents any glitches on the clock caused by the synthesizer or by the clock gating circuit from propagating to any sequential elements in the chip.

The above-referenced description of the summary of the invention captures some, but not all, of the various aspects of the present invention. The claims are directed to some other of the various other embodiments of the subject matter towards which the present invention is directed. In addition, other aspects, advantages and novel features of the invention will become apparent from the following detailed description of the invention when considered in conjunction with the accompanying drawings.

BRIEF DESCRIPTION OF THE DRAWINGS

A better understanding of the invention can be obtained when the following detailed description of various exemplary embodiments is considered in conjunction with the following drawings.

DETAILED DESCRIPTION OF THE INVENTION

Figure 1:
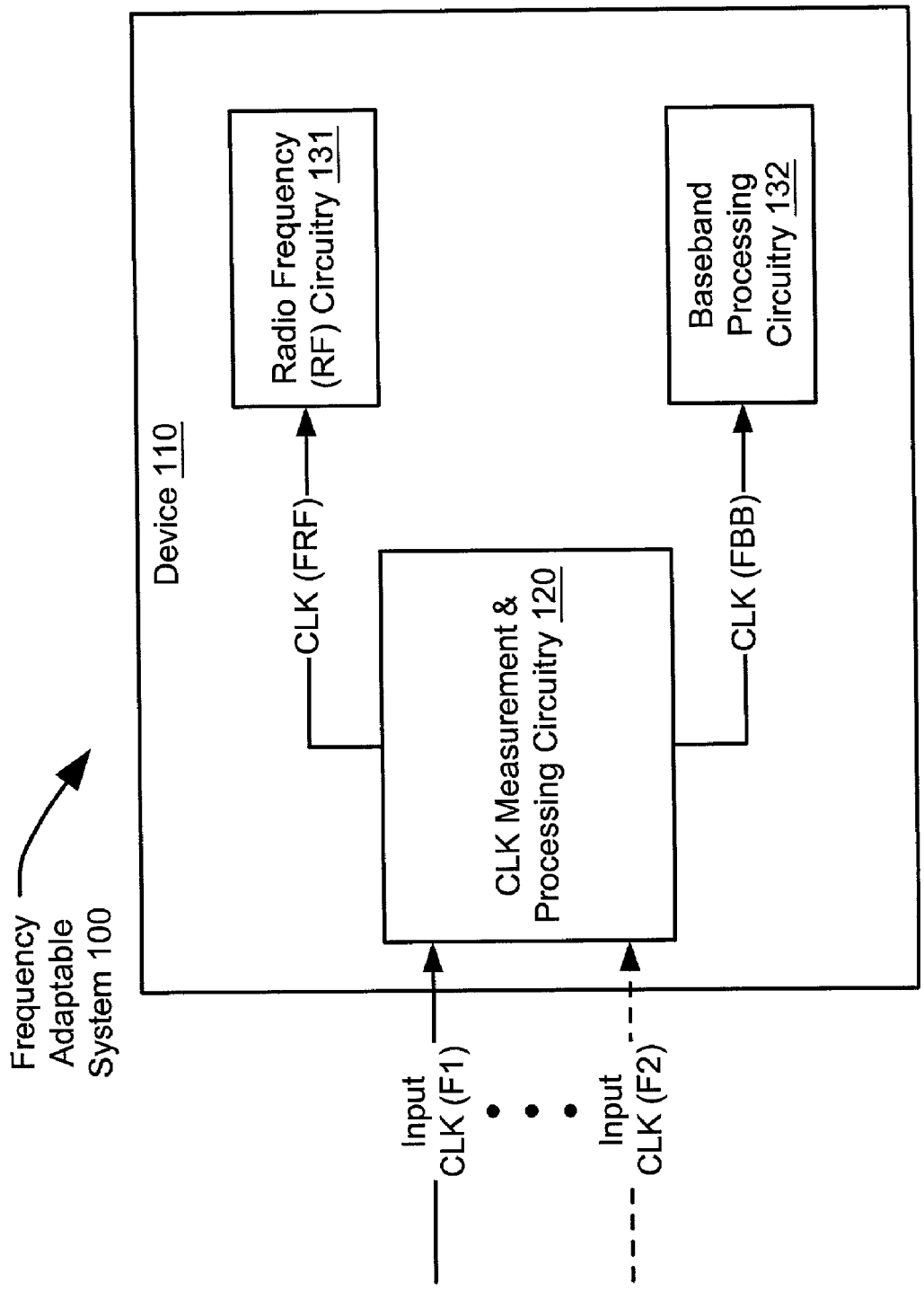
FIG. 1 is a system diagram illustrating an embodiment of a frequency adaptable system that is built in accordance with certain aspects of the present invention.

The present invention is operable to provide proper circuitries within a device with their requisite frequencies irrespective of the clock (CLK) that is being provided to the device from an external source. The terminology device, throughout the description, may be viewed as being a semiconductor device. The present invention may be implemented so that is may accommodate only a finite number of input CLKs that may be used. The present invention also provides a solution to support a number of options in a single device without requiring a pin select on the device.

In one embodiment, an external reference of 32.768 kHz is employed. This frequency is chosen given that it is prevalent in many low power applications within the industry. This external reference frequency may be provided via a general purpose input/output (GPIO) interface port. The device may be implemented to accommodate both radio frequency (RF) circuitry and baseband processing circuitry. The RF circuitry is operable in conjunction with an internal low power oscillator (sometimes referred to as an LPO) that is operable to go into a standby mode (an energy conservation mode) of operation. The LPO may be viewed as being an on-device local OSC as well in certain embodiments. In addition, the internally provided LPO, provided on the chip (the device), may drift undesirably. Alternatively, a received clock of 32.768 kHz may be provided externally; this externally provided CLK is much more accurate than the internally generated LPO, and it can operate in a standby mode for a much longer time than the LPO while maintaining synchronization very well.

The present invention is operable to provide for functionality within a device, sometimes referred to as a chip, that provides support for multiple crystal frequencies. In one embodiment, a fractional-N synthesizer is employed to generate a single basic system operating frequency from among a predetermined set of available crystal oscillator frequencies. The present invention is also able to support frequencies across a wide frequency range. This is in contradistinction to the manner that is employed of many prior art approaches. Employing these prior art approaches and due to limitations in the number of pins available on a packaged part, a required frequency may typically not be strapped externally. This can present a great difficulty in interfacing various devices within a system.

These problems become even more difficult when being implemented within devices that have no nonvolatile storage. When a device has no nonvolatile storage, crystal selection information may not be stored locally; this makes it even more difficult to select and operate the device at the proper frequency. In addition, there are typically only a small finite number of available CLKs that a given device may use as its operating CLK. Oftentimes, these available CLKs do not have the proper frequency, phase, or precision that is required for some or all of the other devices within the system.

The present invention provides a manner in which any available, received CLK may be modified to generate the requisite CLKs for the various devices within the system. The present invention is able to deal with both a CLK being one of a discrete number of available frequencies, and the present invention is also operable to deal with a CLK having any arbitrary frequency. The present invention is able to select from among a predetermined number of options to process a known CLK input to transform it into a suitable CLK for use by various circuitries within the system. Beforehand, the present invention is able to measure the CLK input. Alternatively, the present invention is able to measure and perform any necessary arithmetic on a received CLK having an arbitrary frequency to transform it into a CLK that may be used by the device. For example, when the present invention operates by receiving one CLK from among a finite number of available and expected CLK options, it is then able to employ this 'a priori' information to select from among a predetermined number of finite options to transform that CLK into an appropriate CLK that may be used by the device. In the situation where a received CLK is not within this finite set of available options, then the present invention is still able to perform any necessary processing on the received CLK to transform that CLK into an appropriate CLK that may be used by the device.

The difficulty in interfacing various devices is often based on the lack of available pins that may be employed to support the interfacing between the devices. Such pin-based interfacing is one common manner to provide an external reference from one device to another. However, there is often lack of such available pins on a device, as the pins that are available are usually requisitioned for other uses that may have higher priorities. Without a known reference frequency (typically provided externally), a reliable communication link across the available physical mediums (such as via a USB/UART interface) cannot typically be established with a host device to program the required values into a fractional-N synthesizer on another device. For example, even if a communication link is available, there is oftentimes not a sufficient number of pins to ensure that an external reference signal may also be provided.

The present invention presents a viable solution that does not require any new pins on the device. This allows for any part to be used with any pre-selected crystal oscillator frequencies. In addition, this also allows that an embedded processor may start from internal memory (such as ROM) without being exposed to potentially disruptive clock glitches as a fractional-N synthesizer is locked to its system operating frequency. In addition, the present invention also provides that it may be performed sufficiently fast to allow an embedded microprocessor to establish communication with a host processor in a minimum amount of time. The present invention also provides for a bypass mechanism to allow the selection to be made through strapping signals that may be set or programmed in a manufacturing process of the device.

FIG. 1 is a system diagram illustrating an embodiment of a frequency adaptable system 100 that is built in accordance with certain aspects of the present invention. A device 110 is operable to receive one or more input clock signals, shown as an input CLK (F1), . . . , and an input CLK (F2). These input CLKs may be from among a predetermined number of known input CLKs that the device 110 is expected to receive. Alternatively, the device 110 may be operable to receive an input CLK having an arbitrary characteristic. In either case, the device 110 is able to determine the characteristics of the received CLK and to process the CLK into an appropriate CLK for use by various circuitries within the device 110. In other embodiments, the device 110 is able to provide a CLK signal to an external device.

The device 110 includes a CLK measurement and processing circuitry 120 that is operable to characterize the received input CLK. The CLK measurement and processing circuitry 120 is able to provide a CLK to radio frequency (RF) circuitry 131 that operates using one CLK, and the CLK measurement and processing circuitry 120 is also able to provide a CLK to baseband processing circuitry 132 that operates using perhaps another CLK. There may be instances where the RF circuitry 131 and the baseband processing circuitry 132 operate using a common CLK, but there will also be embodiments where they operate using different CLKs. The requisite CLKs for each of the RF circuitry 131 and the baseband processing circuitry 132 may be different than the input CLK received by the device 110. In this case, the CLK measurement and processing circuitry 120 will ascertain the characteristics of the input CLK and then modify that received CLK as appropriate to accommodate the RF circuitry 131 and the baseband processing circuitry 132.

The CLK measurement and processing circuitry 120 then generates the appropriate CLKs for the RF circuitry 131 and the baseband processing circuitry 132; it provides a CLK having frequency FRF to the RF circuitry 131 and a CLK having a frequency of FBB to the baseband processing circuitry 132. The modification of the received input CLK may include performing number of operations including multiplication of the received input CLK, division of the received input CLK, and/or skewing of the received input CLK.

Figure 2:
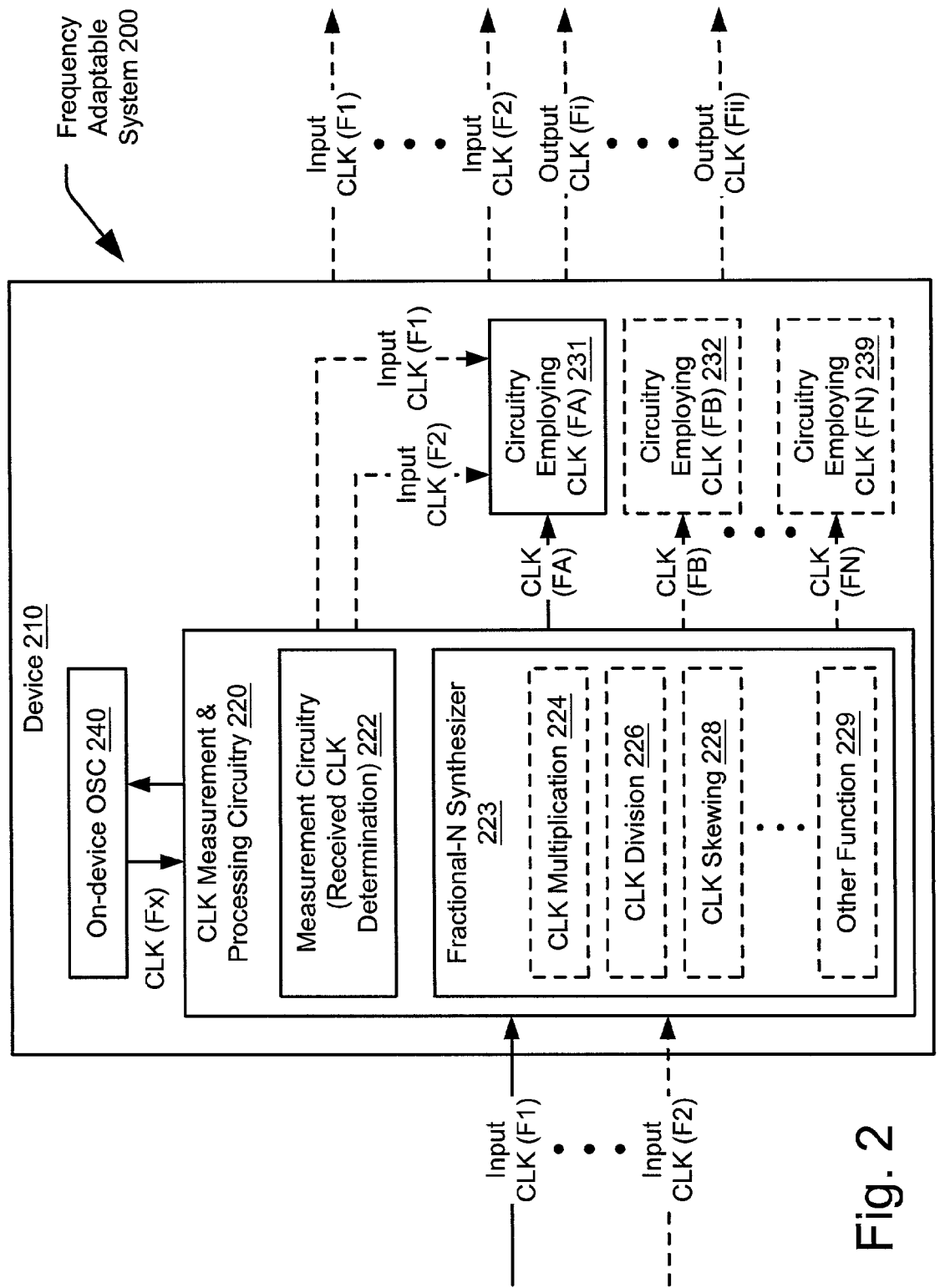
FIG. 2 is a system diagram illustrating another embodiment of a frequency adaptable system that is built in accordance with certain aspects of the present invention.

FIG. 2 is a system diagram illustrating another embodiment of a frequency adaptable system 200 that is built in accordance with certain aspects of the present invention. A device 210 is operable to receive one or more input clock signals, shown as an input CLK (F1), . . . , and an input CLK (F2). These input CLKs may be from among a predetermined number of known input CLKs that the device 210 is expected to receive. Alternatively, the device 210 may be operable to receive an input CLK having an arbitrary characteristic. In either case, the device 210 is able to determine the characteristics of the received CLK and to process the CLK into an appropriate CLK for use by various circuitries within the device 210. In other embodiments, the device 210 is able to provide a CLK signal to an external device. For example, the device 210 may provide CLKs to other devices as shown by externally provided CLKs. There are situations where the received CLKs are precisely the CLKs that other devices require; in this situation, the device 210 is operable to pass on the one or more input clock signals, shown as the one or more input CLK (F1), . . . , and the input CLK (F2) to those devices. Alternatively, there may be situations where some other CLKs are required, and the device 210 is able to modify the received CLKs into other CLKs for use by those other devices; for example, the device 210 can output the one or more CLKs shown as output CLK (Fi), . . . , and the output CLK (Fii).

The device 210 includes a CLK measurement and processing circuitry 220 that is operable to characterize the received input CLKs. The CLK measurement and processing circuitry 220 includes a measurement circuitry 222 and a fractional-N synthesizer 223. The CLK measurement and processing circuitry 220 employs the measurement circuitry 222 to determine the characteristics of the received CLK. Depending on the characteristics of the received input CLK, the CLK measurement and processing circuitry 220 is operable to perform modification of the received input CLK to generate a CLK for use by other circuitries within the device 210 or for use by other external device. The CLK measurement and processing circuitry 220 employs the fractional-N synthesizer 223 to perform any necessary modification of the received CLK.

For example, the fractional-N synthesizer 223 of the CLK measurement and processing circuitry 220 is operable to perform multiplication of the received input CLK (shown by a functional block 224), division of the received input CLK (shown by a functional block 226), and skewing of the received input CLK (shown by a functional block 228). In addition, the CLK measurement and processing circuitry 220 is also able to perform other processing to the received input CLK, as shown in a functional block 229, to modify the received input CLK into another CLK for use by other circuitries within the device 210 or for use by other external device.

The device 210 may also include other circuitries that operate using different CLKs. The CLK measurement and processing circuitry 220 is operable to provide the required CLKs to each of these circuitries. For example, the CLK measurement and processing circuitry 220 is operable to provide a CLK having a frequency FA to a circuitry employing CLK (FA) 231. Similarly, the CLK measurement and processing circuitry 220 is operable to provide a CLK having a frequency FB to a circuitry employing CLK (FB) 232. In addition, the CLK measurement and processing circuitry 220 is operable to provide a CLK having a frequency FN to a circuitry employing CLK (FN) 239. Moreover, when necessary and appropriate, the CLK measurement and processing circuitry 220 is operable to provide CLK(s) having a frequency F1 and/or F2 to the circuitry employing CLK (FA) 231, the circuitry employing CLK (FB) 232, . . . , and the circuitry employing CLK (FN) 239. For example, these situations may be viewed as those where these circuitries happen to require one or more of the input CLKs that are provided to the device 210 by an external source.

In addition, the device 210 includes an on-device oscillator (OSC) 240 in certain embodiments. The on-device OSC 240 is operable to output a CLK having a frequency Fx. The CLK measurement and processing circuitry 220 is operable to perform any necessary modification to the CLK (Fx) to transform it so that it may be used by any of the circuitries 231, 232, . . . , and 239 within the device 210 or any circuitries external to the device 210. There may be embodiments where the locally generated CLK happens to be one of the CLKs required by any of the circuitries 231, 232, . . . , and 239 within the device 210 or any circuitries external to the device 210. In such a case, the CLK (Fx) is passed on to those devices in similar manner as an externally provided CLK would be passed on.

Figure 3:
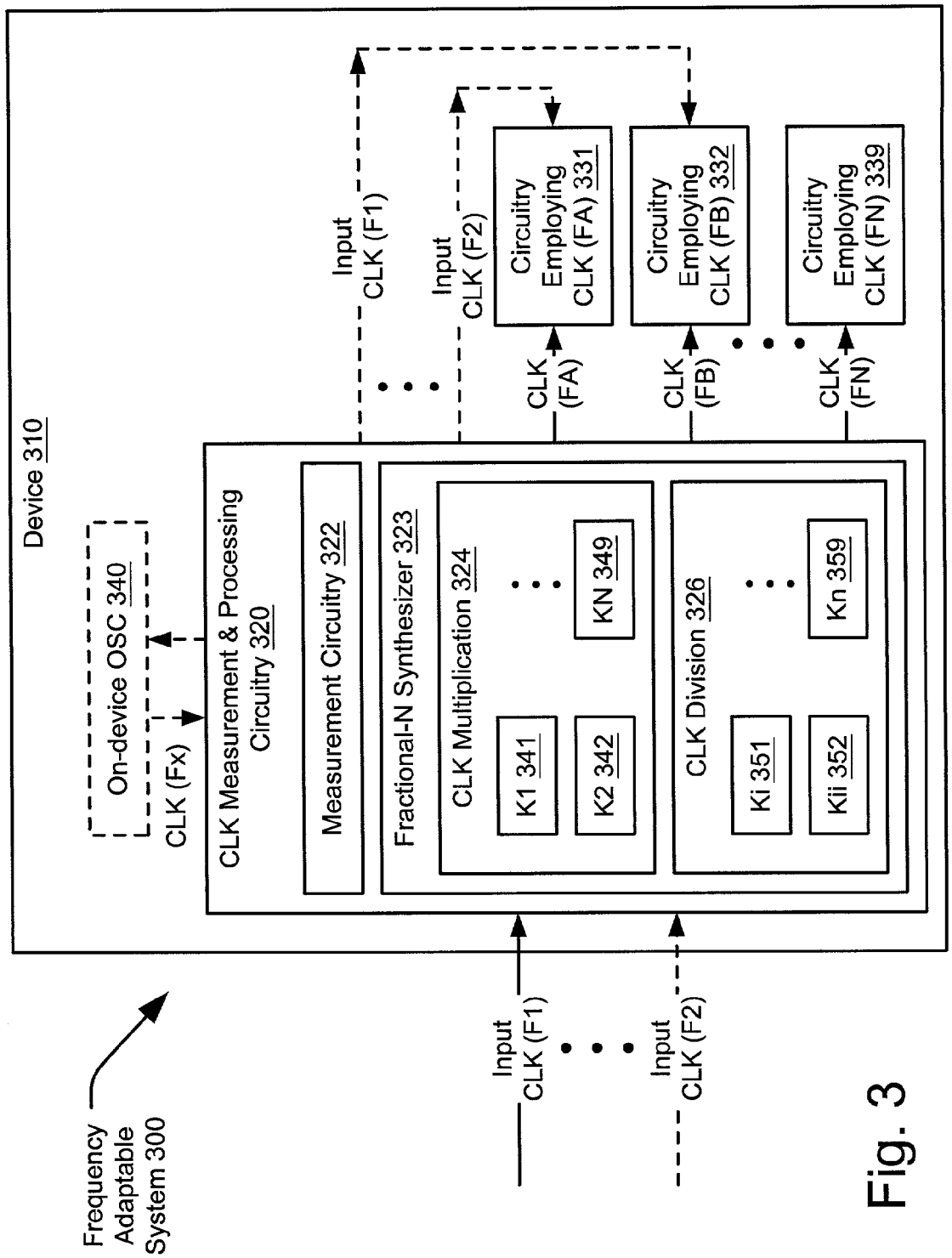
FIG. 3 is a system diagram illustrating another embodiment of a frequency adaptable system that is built in accordance with certain aspects of the present invention.

FIG. 3 is a system diagram illustrating another embodiment of a frequency adaptable system 300 that is built in accordance with certain aspects of the present invention. A device 310 is operable to receive one or more input clock signals, shown as an input CLK (F1), . . . , and an input CLK (F2). Again, these input CLKs may be from among a predetermined number of known input CLKs that the device 310 is expected to receive. Alternatively, the device 310 may be operable to receive an input CLK having an arbitrary characteristic. In either case, the device 310 is able to determine the characteristics of the received CLK and to process the CLK into an appropriate CLK for use by various circuitries within the device 310. In other embodiments, the device 310 is able to provide a CLK signal to an external device. In addition, there may be situations where the very CLKs that are received by the device 310 are required by circuitries within the device 310. However, the device 310 is able to modify the received CLKs into other CLKs for use by those circuitries.

The device 310 includes a CLK measurement and processing circuitry 320 that is operable to characterize and process the received input CLKs. The CLK measurement and processing circuitry 320 includes a measurement circuitry 322 and a fractional-N synthesizer 323. The CLK measurement and processing circuitry 320 employs the measurement circuitry 322 to determine the characteristics of the received CLK. Depending on the characteristics of the received input CLK, the CLK measurement and processing circuitry 320 is operable to perform modification of the received input CLK to generate a CLK for use by other circuitries within the device 310 or for use by other external device. The CLK measurement and processing circuitry 320 employs the fractional-N synthesizer 323 to perform any of this necessary modification.

For example, the fractional-N synthesizer 323 of the CLK measurement and processing circuitry 320 is operable to perform multiplication of the received input CLK (shown by a functional block 324). The multiplication of the received input CLK may be of a constant selected from among a predetermined number of constants shown as constants K1 341, K2 342, . . . and KN 349. When the received input CLK is determined to be one of a predetermined number of CLKs, then the appropriate constant is switched in to modify the received input CLK, by multiplying by the appropriate constant, to an appropriate CLK for use by the various circuitries within the device 310.

In addition, the fractional-N synthesizer 323 of the CLK measurement and processing circuitry 320 is operable to perform division of the received input CLK (shown by a functional block 326). The division of the received input CLK may be of a constant selected from among a predetermined number of constants shown as constants Ki 351, Kii 352, . . . , and Kn 359. When the received input CLK is determined to be one of a predetermined number of CLKs, then the appropriate constant is switched in to modify the received input CLK, by dividing by the appropriate constant, to an appropriate CLK for use by the various circuitries within the device 310.

In addition, the CLK measurement and processing circuitry 320 is also able to perform other processing to the received input CLK to modify the received input CLK into another CLK for use by other circuitries within the device 310 or for use by other external device.

The device 310 includes other circuitries that operate using different CLKs. The CLK measurement and processing circuitry 320 is operable to provide the required CLKs to each of these circuitries. For example, the CLK measurement and processing circuitry 320 is operable to provide a CLK having a frequency FA to a circuitry employing CLK (FA) 331. Similarly, the CLK measurement and processing circuitry 320 is operable to provide a CLK having a frequency FB to a circuitry employing CLK (FB) 332. In addition, the CLK measurement and processing circuitry 320 is operable to provide a CLK having a frequency FN to a circuitry employing CLK (FN) 339. Moreover, when necessary and appropriate, the CLK measurement and processing circuitry 320 is operable to provide CLK(s) having a frequency F1 and/or F2 to the circuitry employing CLK (FA) 331, the circuitry employing CLK (FB) 332, ..., and the circuitry 20 employing CLK (FN) 339. Shown specifically within the embodiment of the FIG. 3 is the situation where the input CLK (F1) is passed through to the circuitry employing CLK (FA) 331 where the frequency F1 is substantially equal to the frequency FA, and the input CLK (F2) is passed through to the circuitry employing CLK (FB) 332 where the frequency F2 is substantially equal to the frequency FB. For example, these situations may be viewed as those where these circuitries happen to require one or more of the input CLKs that are provided to the device 310 by an external source.

In addition, the device 310 includes an on-device oscillator (OSC) 340 in certain embodiments. The on-device OSC 340 is operable to output a CLK having a frequency Fx. The CLK measurement and processing circuitry 320 is operable to perform any necessary modification to the CLK (Fx) to transform it so that it may be used by any of the circuitries 331, 332, ..., and 339 within the device 310 or any circuitries external to the device 310. There may be embodiments where the locally generated CLK happens to be one of the CLKs required by any of the circuitries 331, 332, ..., and 339 within the device 310 or any circuitries external to the device 310. In such a case, the CLK (Fx) is passed on to those devices in similar manner as an externally provided CLK would be passed on.

Figure 4:
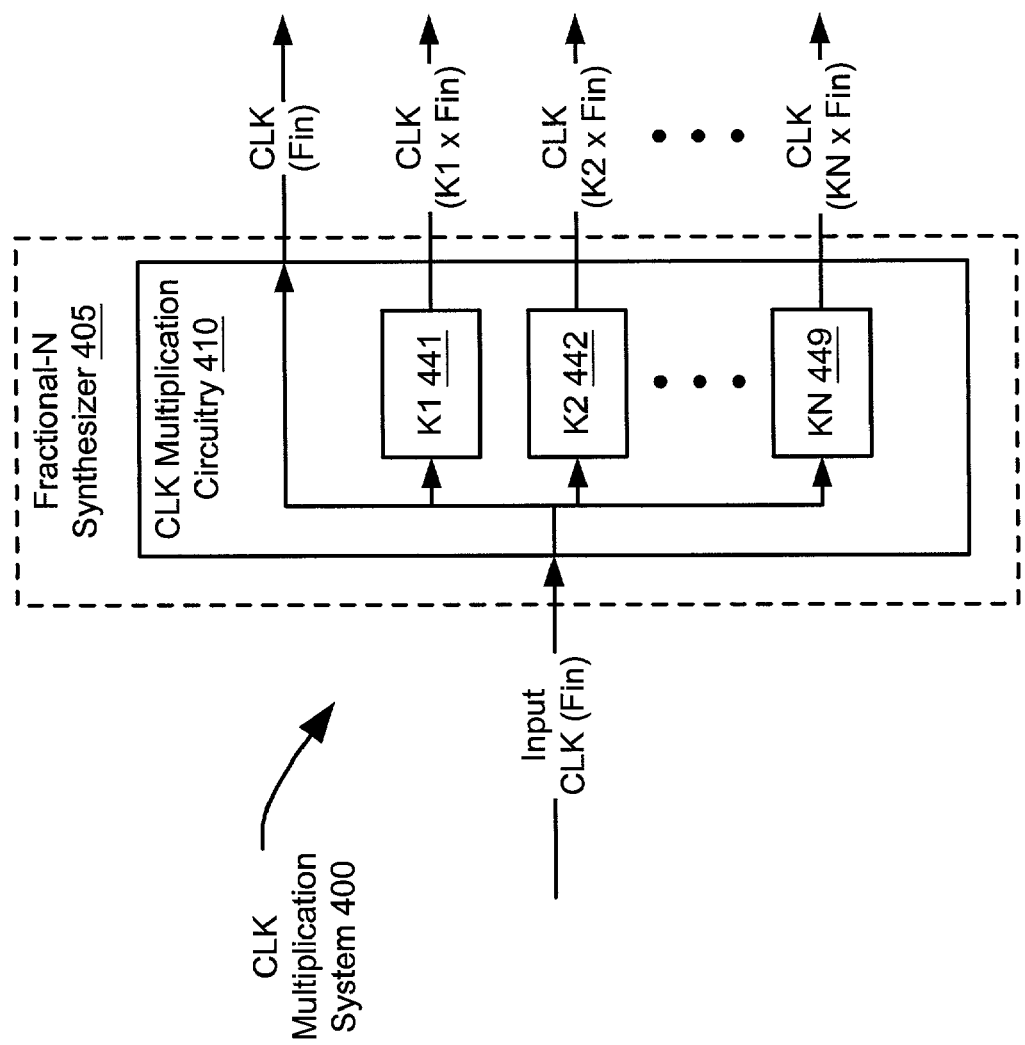
FIG. 4 is a system diagram illustrating an embodiment of a clock (CLK) multiplication system that is built in accordance with certain aspects of the present invention.

FIG. 4 is a system diagram illustrating an embodiment of a clock (CLK) multiplication system 400 that is built in accordance with certain aspects of the present invention. An input CLK having a frequency 'Fin' is provided to a CLK multiplication circuitry 410. The CLK multiplication circuitry 410 may be viewed as being a part of a fractional-N synthesizer 405 in accordance with certain aspects of the present invention. The CLK multiplication circuitry 410 includes a number of constants that may be used to multiply the input CLK (Fin). The CLK multiplication circuitry 410 is also operable to pass the input CLK (Fin) through as an output shown as CLK (Fin). This may be viewed as an embodiment where the multiplication constant is unity.

For example, the CLK multiplication circuitry 410 includes a multiplication constant K1 441, a multiplication constant K2 442, ..., and a multiplication constant KN 449. The multiplication constants 441, 442, ..., and 449 may be used to transform the frequency of the input CLK into CLKs of other frequencies, as shown by CLK (K1×Fin), CLK (K2×Fin), ..., and CLK (KN×Fin). When the input CLK is one of a predetermined number of input CLKs, the present invention is operable to multiply the input CLK by one of the constants. The decision making may be programmed in such an embodiment when a device is expecting an input CLK having certain characteristics. For example, a device may be designed to receive a number of CLKs having known frequencies, then there may be a mapping of which constants that are used to multiply the input CLK to accommodate the various circuitries within the device with the appropriate CLKs.

Figure 5:
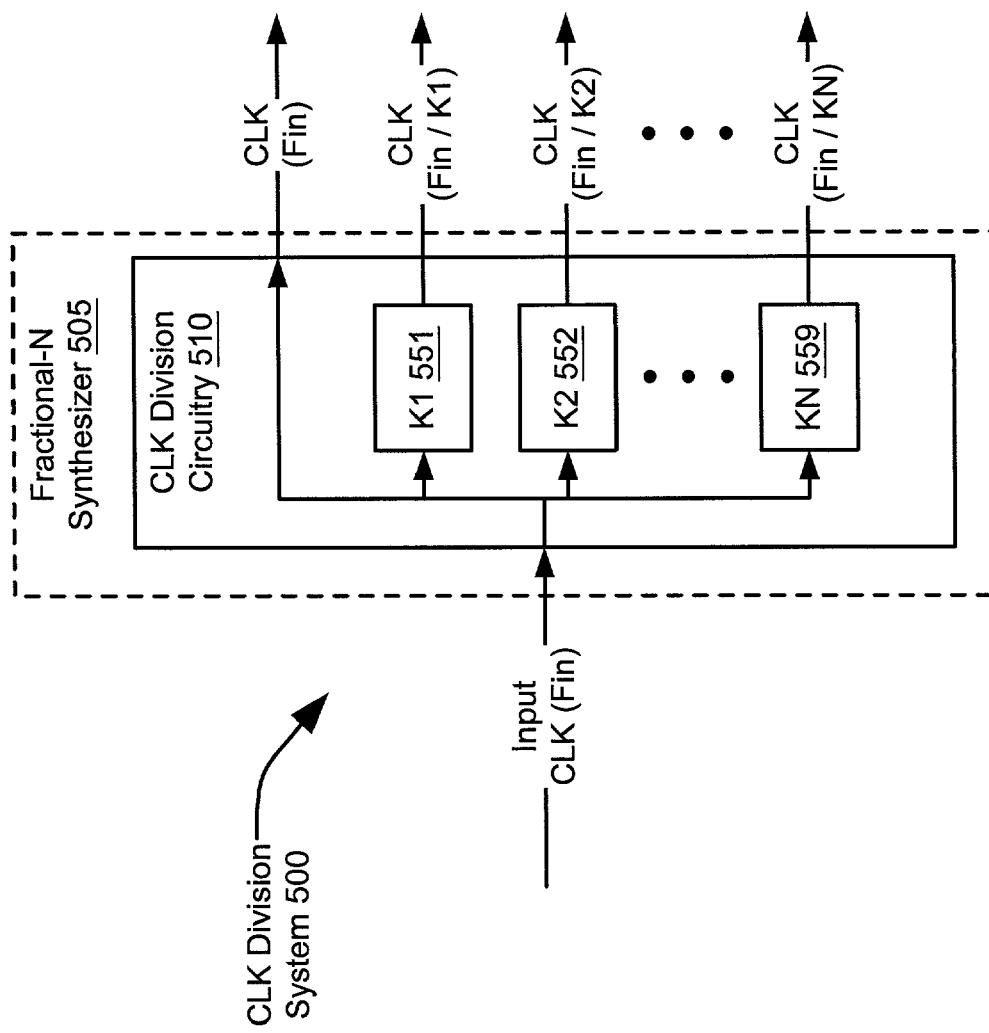
FIG. 5 is a system diagram illustrating an embodiment of a clock (CLK) division system that is built in accordance with certain aspects of the present invention.

FIG. 5 is a system diagram illustrating an embodiment of a clock (CLK) division system 500 that is built in accordance with certain aspects of the present invention. An input CLK having a frequency 'Fin' is provided to a CLK division circuitry 510. The CLK division circuitry 510 may be viewed as being a part of a fractional-N synthesizer 505 in accordance with certain aspects of the present invention. The CLK division circuitry 510 includes a number of constants that may be used to divide the input CLK (Fin). The CLK division circuitry 510 is also operable to pass the input CLK (Fin) through as an output shown as CLK (Fin). This may be viewed as an embodiment where the division constant is unity.

For example, the CLK division circuitry 510 includes a division constant K1 551, a division constant K2 552, ..., and a division constant KN 559. The division constants 551, 552, ..., and 559 may be used to transform the frequency of the input CLK into CLKs of other frequencies, as shown by CLK (Fin/K1), CLK (Fin/K2), ..., and CLK (Fin/KN). When the input CLK is one of a predetermined number of input CLKs, the present invention is operable to divide the input CLK by one of the constants. The decision-making may be programmed in such an embodiment when a device is expecting an input CLK having certain characteristics. For example, a device may be designed to receive a number of CLKs having known frequencies, then there may be a mapping of which constants that are used to divide the input CLK to accommodate the various circuitries within the device with the appropriate CLKs.

Figure 6:
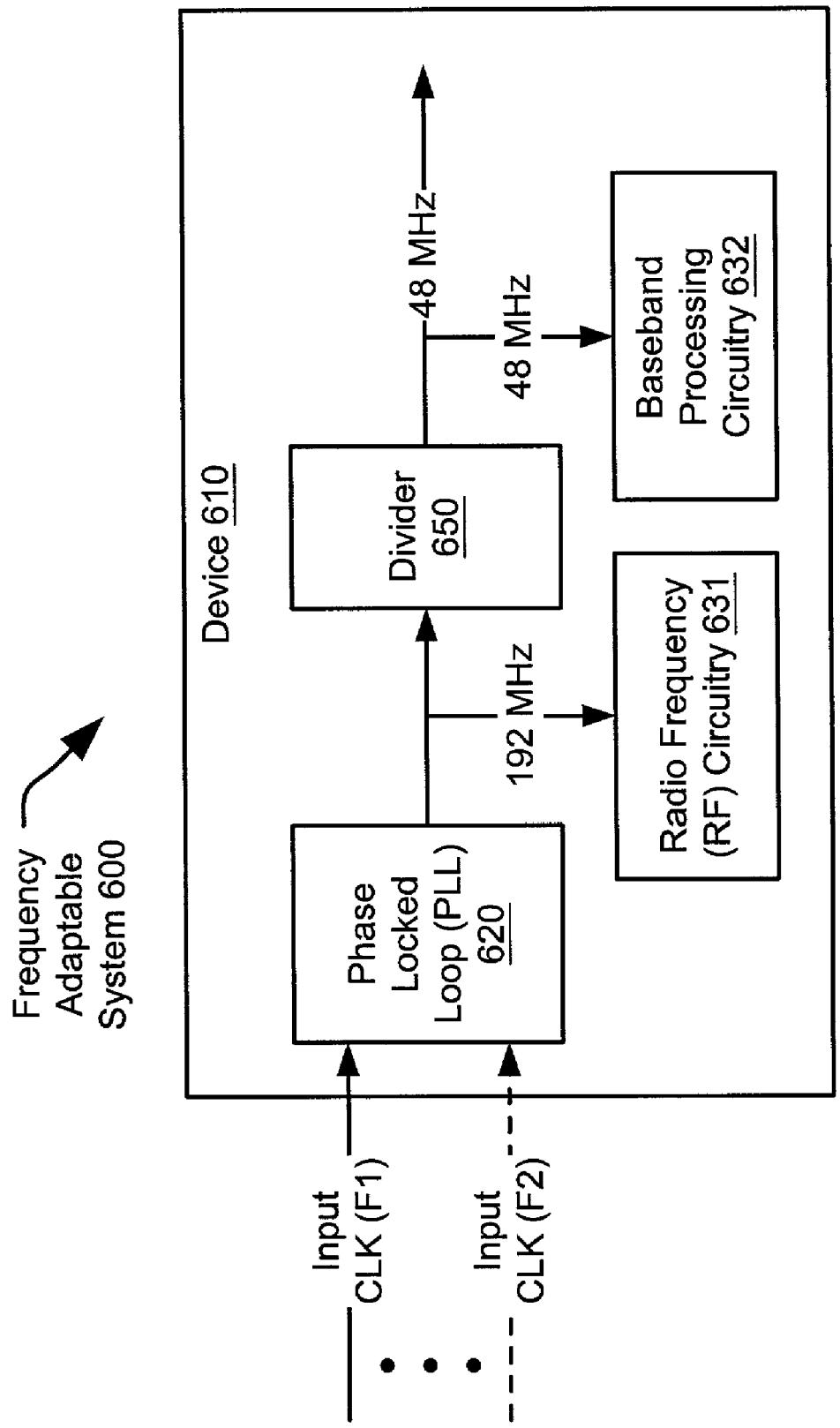
FIG. 6 is a system diagram illustrating another embodiment of a frequency adaptable system that is built in accordance with certain aspects of the present invention.

FIG. 6 is a system diagram illustrating another embodiment of a frequency adaptable system 600 that is built in accordance with certain aspects of the present invention. A device 610 is operable to receive one or more input clock signals, shown as an input CLK (F1), ..., and an input CLK (F2). The device 610 includes a phase locked loop (PLL) 620, a divider 650, a radio frequency (RF) circuitry 631, and a baseband processing circuitry 632. The RF circuitry 631 and the baseband processing circuitry 632 each require different CLKs having different frequencies.

In general, a phase locked loop (PLL) is an electronic circuit that synchronizes the signal from an oscillator with a second input signal (called the "reference"), so that they operate at the same frequency. The loop synchronizes the PLL to the input reference by comparing their phases and controls the PLL in such a manner that a constant phase relationship is maintained between the two signals. If it is determined that the incoming signal and the local signal are in phase (the two clocks are in phase), then no phase adjustment need be performed. However, if the regenerated clock from the PLL lags the reference signal, then a phase adjuster needs to compensate for this by advancing the regenerated clock. If it leads the reference signal, the phase adjuster needs to make the opposite change.

Within the FIG. 6, the PLL 620 locks onto an input CLK and provides this to the divider 650. When the input CLK is of a frequency required by the RF circuitry 631, namely 192 MHz, then the PLL 620 locks onto that frequency and provides it to the RF circuitry 631 and also to the divider 650. The divider 650 divides the 192 MHz received input CLK by '4' to generate a 48 MHz CLK that is provided to the baseband processing circuitry 632. The FIG. 6 shows one specific embodiment where RF circuitry 631 operates at 192 MHz, and baseband processing circuitry 632 operates at 48 MHz. However, those persons having skill in the art will appreciate that other operating frequencies are also envisioned within the scope and spirit of the invention. The particular frequencies of 192 MHz and 48 MHz, and the divider factor of '4' are exemplary of one embodiment of the present invention. Other frequency situations are also envisioned as well.

The present invention is operable to be performed in various operational modes, including those of power savings and energy conversation modes as well.

Figure 7:
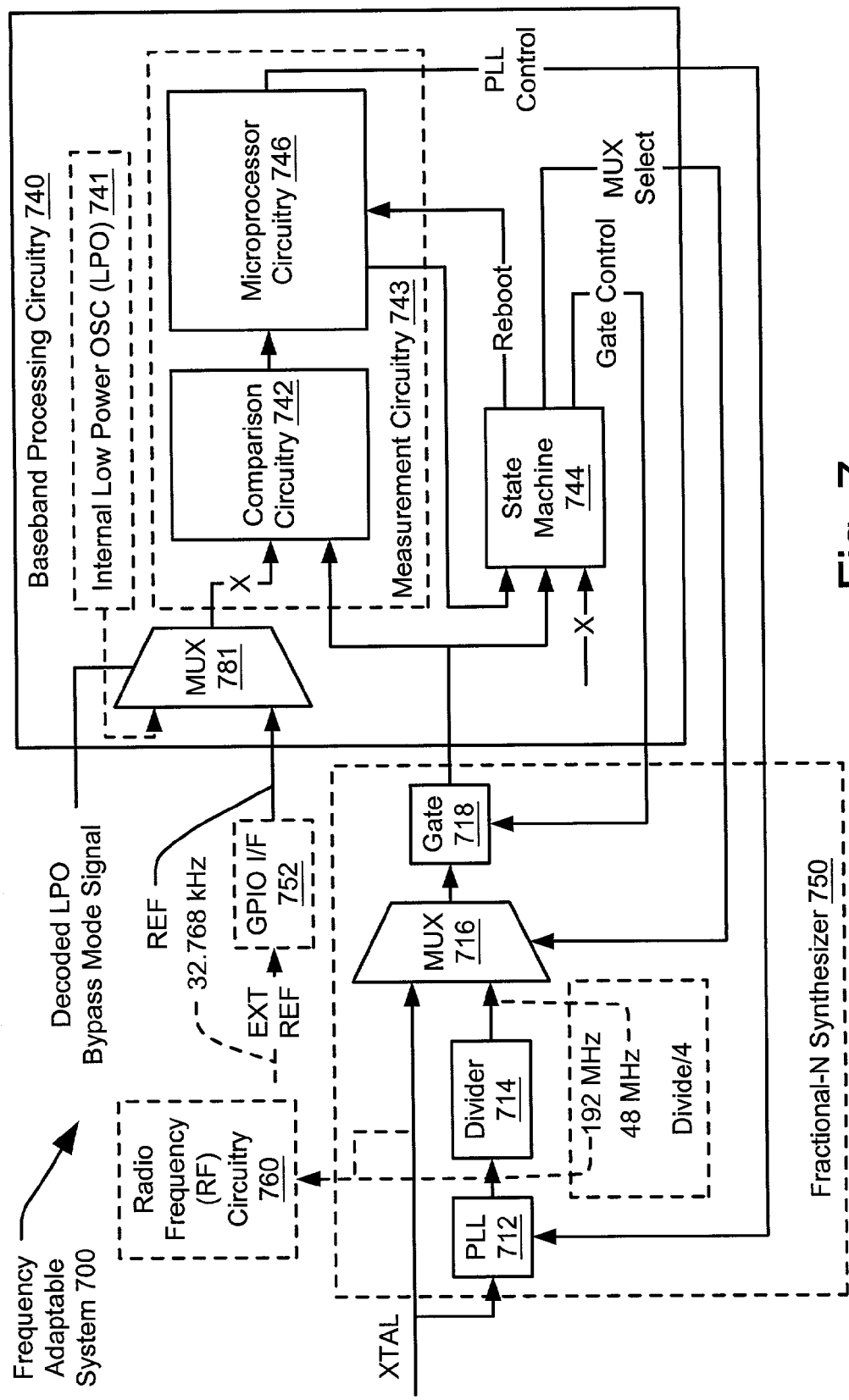
FIG. 7 is a system diagram illustrating another embodiment of a frequency adaptable system that is built in accordance with certain aspects of the present invention.

FIG. 7 is a system diagram illustrating another embodiment of a frequency adaptable system 700 that is built in accordance with certain aspects of the present invention. An unknown CLK signal input, shown as XTAL, is provided simultaneously to a phase locked loop (PLL) 712 and to a multiplexor (MUX) 716. The output of the PLL 712 is provided to a divider 714.

The divider 714 is operable to divide the input CLK by '4' in certain embodiments. For example, if the CLK coming into the divider 714 is 192 MHz, then the output of the divider 714 is then 48 MHz. This output from the divider 714 is also provided to the MUX 716. The particular value of the divider 714, shown by '4', is exemplary. Other values of division may also be performed without departing from the scope and spirit of the invention. The output of the MUX 716 is provided to a gate 718 that may be used to shut the output of the MUX 716 from continuing to a baseband processing circuitry 740. The gate 718 allows the ability to turn off the CLK to the entire baseband processing circuitry 740 to allow a state machine 744 to generate a reset within the frequency adaptable system 700. The PLL 712, the divider 714, the MUX 716, and the gate 718 may all be viewed as being part of a fractional-N synthesizer 750 that is built in accordance with the present invention.

The baseband processing circuitry 740 includes at least a state machine 744, a comparison circuitry 742, and a microprocessor circuitry 746. The comparison circuitry 742 and the microprocessor circuitry 746 may be viewed as being part of a measurement circuitry 743 that is built in accordance with the present invention. The measurement circuitry 743 is designed to fulfill at least two missions. One is to compare a received signal with an external reference (EXT REF) for the purpose of selecting the correct fractional-N synthesizer programming values that should be fed back so that the fractional-N synthesizer may generate the proper frequency. One other mission of the measurement circuitry 743 is to measure the output of an internally supported low-power oscillator (LPO 741) using the external oscillator frequency (XTAL) as a reference. The circuit need not perform both of these functions simultaneously.

The output of the gate 718 is provided to both the state machine 744 and the comparison circuitry 742. In addition, both the state machine 744 and the comparison circuitry 742 are provided an LPO CLK signal (shown as 'X'). This LPO CLK signal is selected from a MUX 781. The inputs to the MUX 781 are the output signal from an LPO 741 and an external LPO CLK signal (REF) that may be provided by a GPIO I/F 752. The MUX 781 selects between the external LPO clock (REF), and the internally generated LPO signal from the LPO 741. The select on the MUX 781 is controlled by a decoded LPO BYPASS MODE signal. The LPO BYPASS MODE signal is determined by mode strap setting.

The output of the comparison circuitry 742 is provided to the microprocessor circuitry 746. The microprocessor circuitry 746 provides an input to the state machine 744 as well. The state machine 744 is operable to provide a reboot signal to the microprocessor circuitry 746. The microprocessor circuitry 746 also is operable to provide PLL control signal as feedback to the PLL 712; this PLL control may be viewed as the control provided to program the PLL to generate the proper frequency that is required; this communication is via a serial interface in certain embodiments. The state machine 744 is operable to provide gate control as feedback to the gate 718; the state machine 744 is also operable to provide the MUX select signal as feedback to the MUX 716.

The operation of the frequency adaptable system 700 may be described as follows: the system is started up to its initial configuration. The initialization procedure may be performed within a predetermined period of time; this time is determined based on the XTAL signal. After the system determines the initial configuration of the PLL 712, then the gate 718 gates off the signal to the baseband processing circuitry 740, and the state machine 744 sets the reboot bit of the microprocessor circuitry 746. Then, the microprocessor circuitry 746 is reset, but the 're-boot' bit has already been set before by the state machine 744. Therefore, the system skips the PLL configuration/initialization routine based on the XTAL signal.

In some embodiments, the fractional-N synthesizer 750 is further communicatively coupled to a radio frequency (RF) circuitry 760. The RF circuitry 760 may be viewed as circuitry that operates employing a RF range frequency. The fractional-N synthesizer 750 is operable to provide the necessary frequency, for proper operation, to both of the baseband processing circuitry and the RF circuitry 760.

Figure 8:
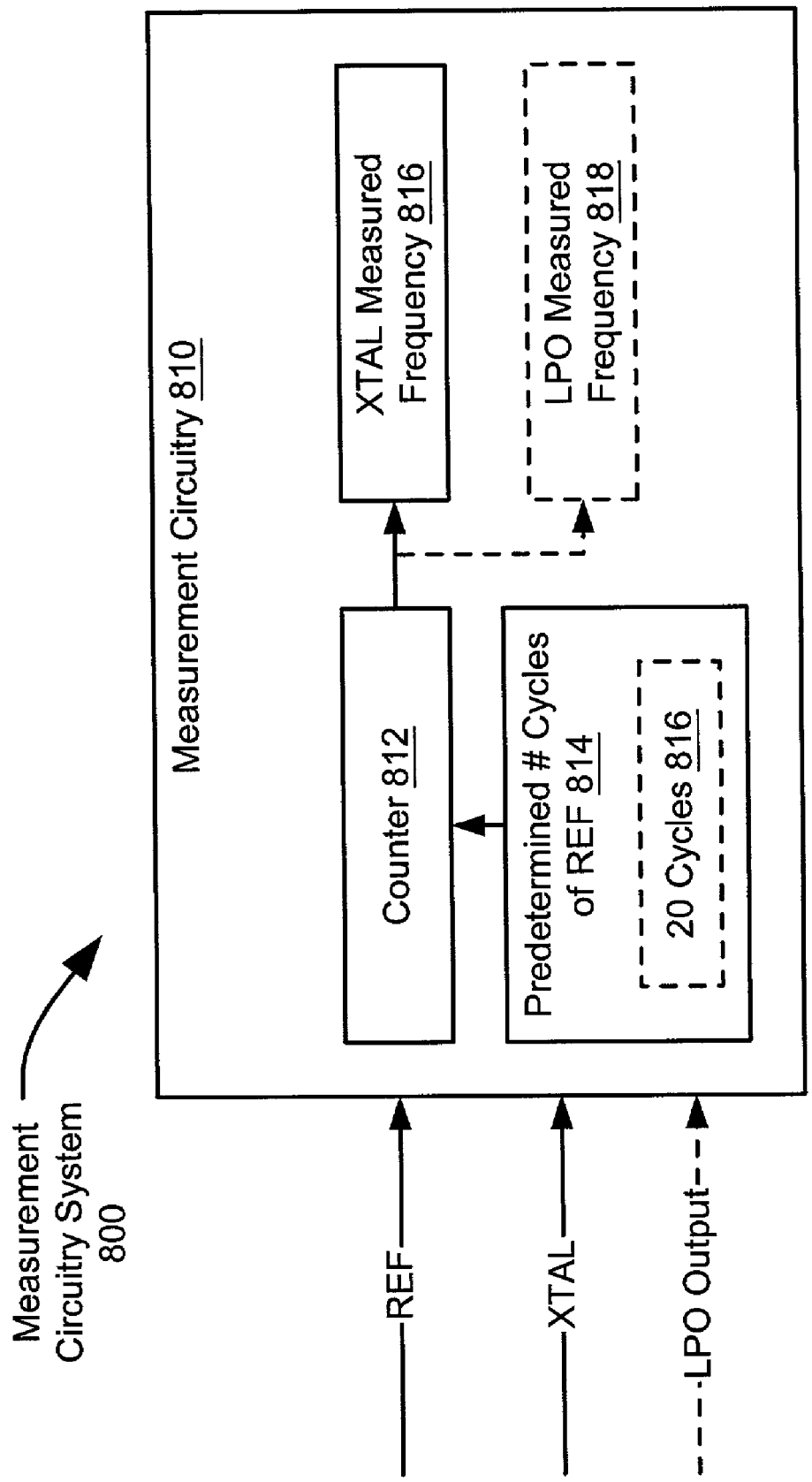
FIG. 8 is a system diagram illustrating an embodiment of a measurement circuitry system that is built in accordance with certain aspects of the present invention.

FIG. 8 is a system diagram illustrating an embodiment of a measurement circuitry system 800 that is built in accordance with certain aspects of the present invention. A measurement circuitry 810 received an external clock reference (shown as REF) having a known frequency and an unknown CLK signal shown as XTAL. The XTAL signal may be viewed as being a received CLK frequency; this is the crystal input frequency. In addition, the measurement circuitry 810 is also operable to receive the output of an internally supported low-power oscillator (LPO).

The measurement circuitry 810 employs a counter 812, and it counts over a predetermined number of cycles of the REF signal, as shown in a functional block 814. The number of cycles within the functional block 812 may be programmed, and the number include 20 cycles (as shown in a functional block 816) in certain embodiments. By knowing the frequency of the external clock REF, then the frequency of the XTAL signal may be determined, as shown in a functional block 816. In addition, the measurement circuitry 810 is also operable to determine the frequency of the LPO (as shown in a functional block 818). In addition, this period of time may be used as the time during which the fractional-N synthesizer is allowed to lock at a correct system operating frequency. This period of time may also be viewed as the time during which the feedback and programming values may be generated and fed back to the fractional-N synthesizer.

Figure 9:
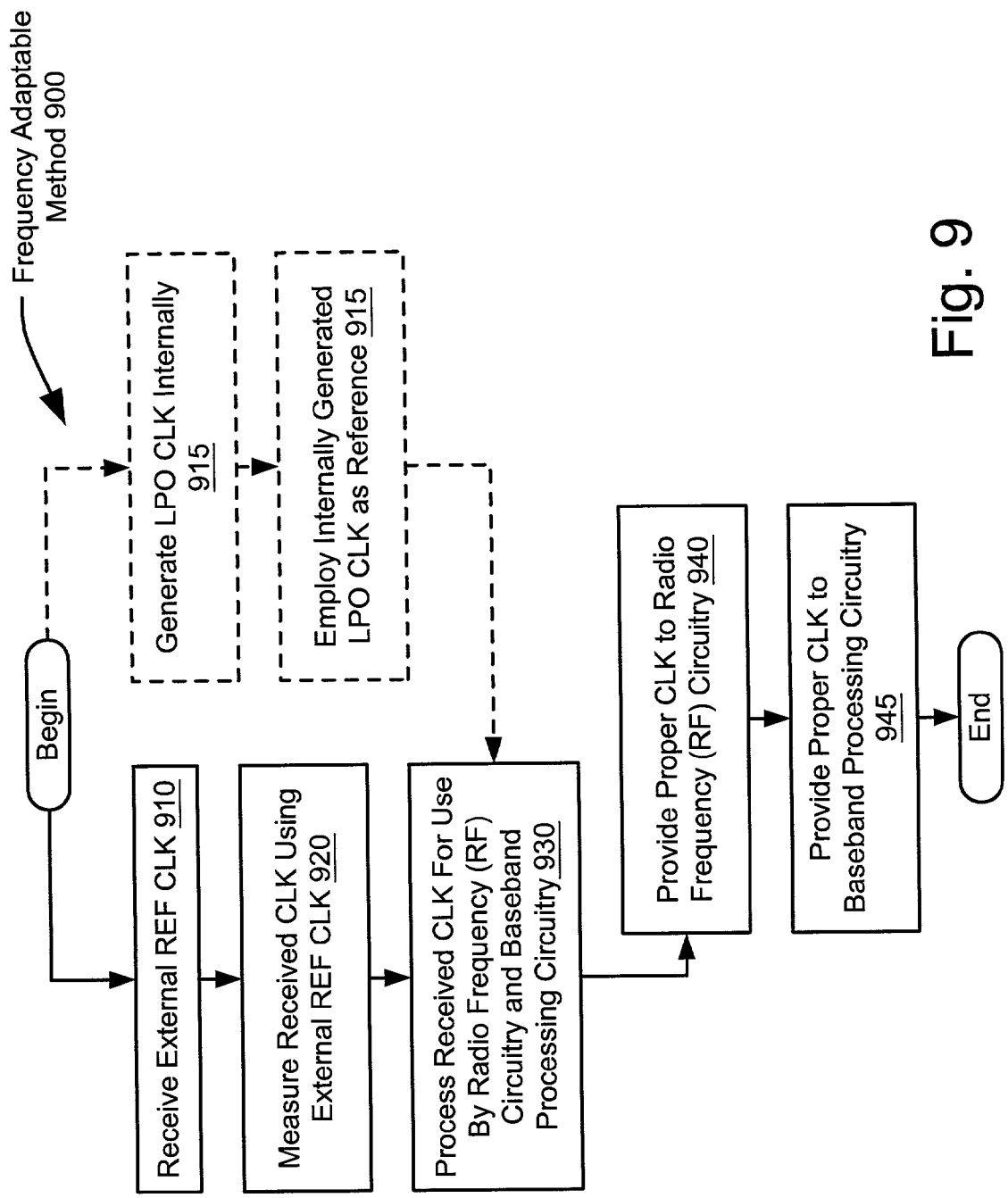
FIG. 9 is an operational flow diagram illustrating an embodiment of a frequency adaptable method that is performed in accordance with certain aspects of the present invention.

FIG. 9 is an operational flow diagram illustrating an embodiment of a frequency adaptable method 900 that is performed in accordance with certain aspects of the present invention. In a block 910, an external clock signal (CLK) reference (REF) is received. Then, a received CLK is measured in a block 920 using the external clock signal (CLK REF). Any necessary parameters of the CLK are characterized in the block 920. Afterwards, the received CLK is processed for use by radio frequency (RF) circuitry and baseband processing circuitry as shown in a block 930. This processing in the block 930 may include modifying the CLK so that it is in a form suitable for use by RF circuitry and baseband processing circuitry. This may involve processing the CLK to generate two new CLKs that are suitable for use by the RF circuitry and the baseband processing circuitry. There may be some instances where the RF circuitry and the baseband processing circuitry employ a common CLK, but they will often employ two different CLKs. Then, the appropriate CLK is provided to the RF circuitry in a block 940. Then, the appropriate CLK is provided to the baseband processing circuitry in a block 945.

In alternative embodiments, an LPO CLK is generated internally as shown in a block 915. For example, this may be performed using an internally support low power oscillator (LPO). Afterwards, the internally generated LPO CLK is employed as a reference. This internally generated LPO CLK may be employed as a reference to provide for energy conservation that allows the accurate system CLK to be powered off for short periods of time to save power. The internally generated LPO CLK is used as the reference during these periods when the accurate system CLK has been powered off. Then, the method continues on with the operations shown and described above from the operations of the block 930 and so on.

Figure 10:
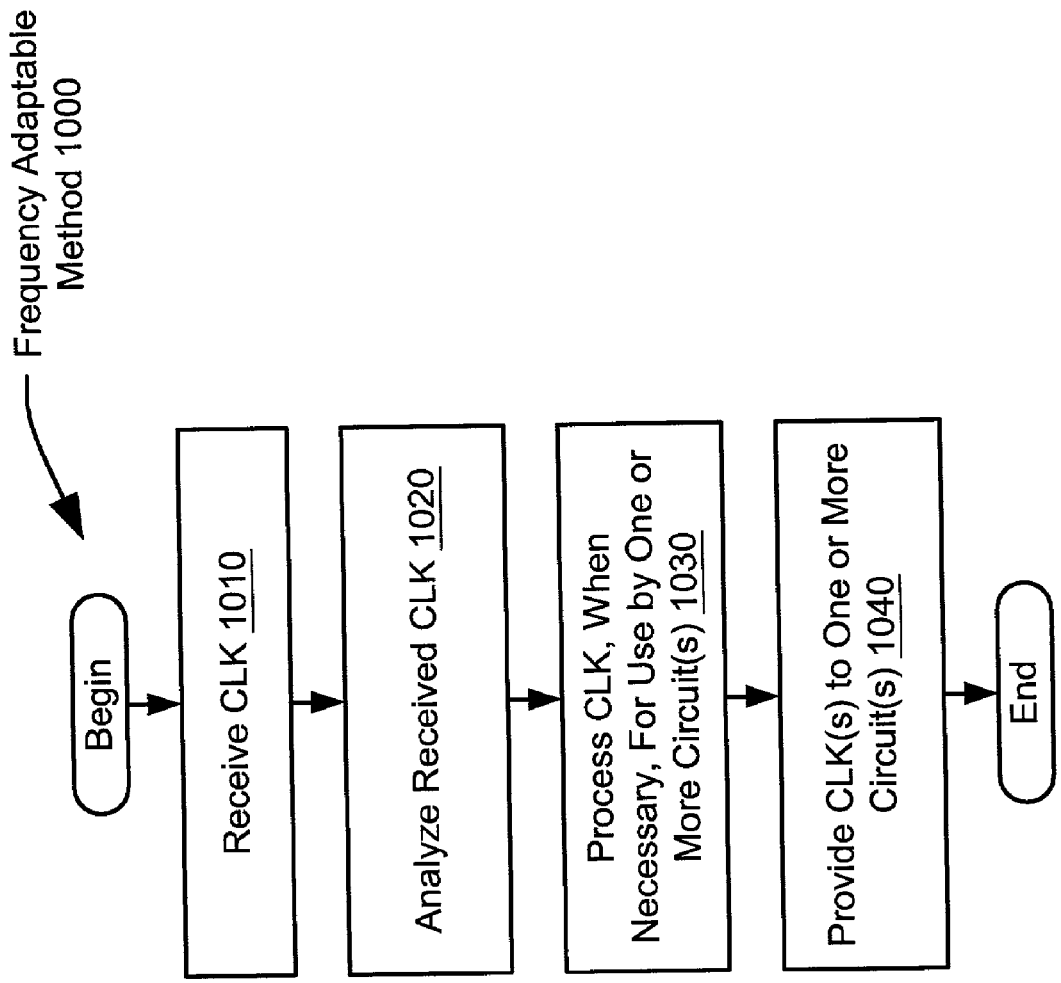
FIG. 10 is an operational flow diagram illustrating another embodiment of a frequency adaptable method that is performed in accordance with certain aspects of the present invention.

FIG. 10 is an operational flow diagram illustrating another embodiment of a frequency adaptable method 1000 that is performed in accordance with certain aspects of the present invention. In a block 1010, a CLK is received. That received CLK is analyzed in a block 1020. The received CLK may be received by a device from an external source; alternatively, the received CLK may be received from an internally supported local oscillator.

The analysis may include measuring the frequency of the CLK, the phase of the CLK, and/or the precision of the CLK in various embodiments. In a block 1030, the CLK is processed, when necessary to transform that CLK into a form that is suitable for use by one or more circuits within a system. After these one or more new CLKs is/are generated in the block 1030 is provided to the one or more circuits within a system.

Figure 11:
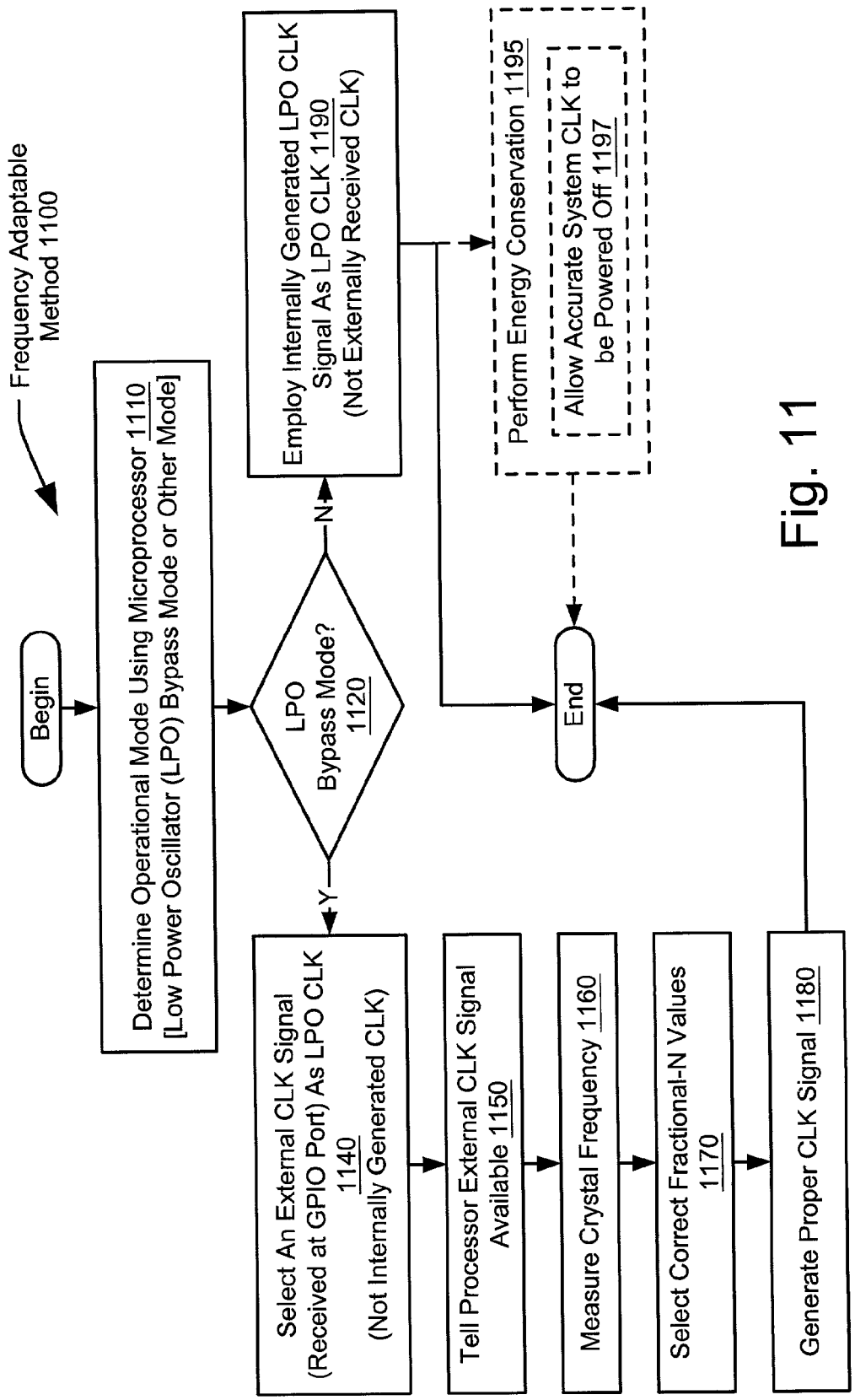
FIG. 11 is an operational flow diagram illustrating another embodiment of a frequency adaptable method that is performed in accordance with certain aspects of the present invention.

FIG. 11 is an operational flow diagram illustrating another embodiment of a frequency adaptable method 1100 that is performed in accordance with certain aspects of the present invention. In a block 1110, the operational mode that is used within a system is determined using a microprocessor. The operational mode may be a low power oscillator (LPO) bypass mode or some other operational mode. Then, in a decision block 1120, it is determined whether the operational mode is the LPO bypass mode.

If the operational mode is in fact the LPO bypass mode as determined in the decision block 1120, then an externally provided CLK signal (received via a general purpose input/output (GPIO) port) is employed as the LPO CLK; the internally generated LPO CLK is not employed in this mode. Then, in a block 1150, a processor is told that the externally provided CLK signal is in fact available. This externally provided CLK signal, received via the GPIO port, will have a frequency of substantially 32.768 kHz. The crystal frequency is in fact measured in a block 1160 where the externally provided CLK signal (received via a GPIO port) is employed as the reference to perform the measurement. After the measurement has been performed, then the correct fractional-N values are selected (in a block 1170) to perform any necessary modification of a received CLK signal to generate a proper CLK signal (in a block 1180) for use within the various portions of a circuitry.

However, if the operational mode is not the LPO bypass mode as determined in the decision block 1120, then an internally generated LPO CLK is employed as the reference as shown in a block 1190. Here, the internally generated LPO CLK, employed as a reference, is good enough to determine the frequency of the system clock input to within the accuracy necessary to distinguish potential clock selections. In alternative embodiments, a variation of the operations within the FIG. 11 may be viewed as including performing energy conservation as shown in a block 1195. This may involve allowing an accurate system CLK to be powered off for predetermined periods of time or adaptively identified periods of time. This energy conservation may achieve improved system performance.

It is noted that the LPO CLK, whether employed from an externally generated CLK or employed from an internally generated signal, is typically not used as an input to a fractional-N synthesizer where it is modified via either multiplication or division.

The operations of the LPO bypass mode may also be described as follows:

The function of this mode is twofold. The LPO bypass mode is first operable to select an external signal being applied to one of the GPIO as the LPO clock instead of an internally generated signal of uncertain accuracy. The external signal should have a frequency that is substantially 32.768 kHz. In addition, the LPO bypass mode is also operable to tell the processor that an external clock reference is available (again, frequency of substantially 32.768 kHz), so that the crystal frequency can be measured and the correct fractional-N values selected for any necessary modification of a received CLK using a fractional-N synthesizer.

The internal LPO is typically only used as a minimally accurate reference for the purpose of allowing an accurate system clock to be powered off for short periods of time to save power. This may be performed in a variety of power conservation modes of operation.

Figure 12:
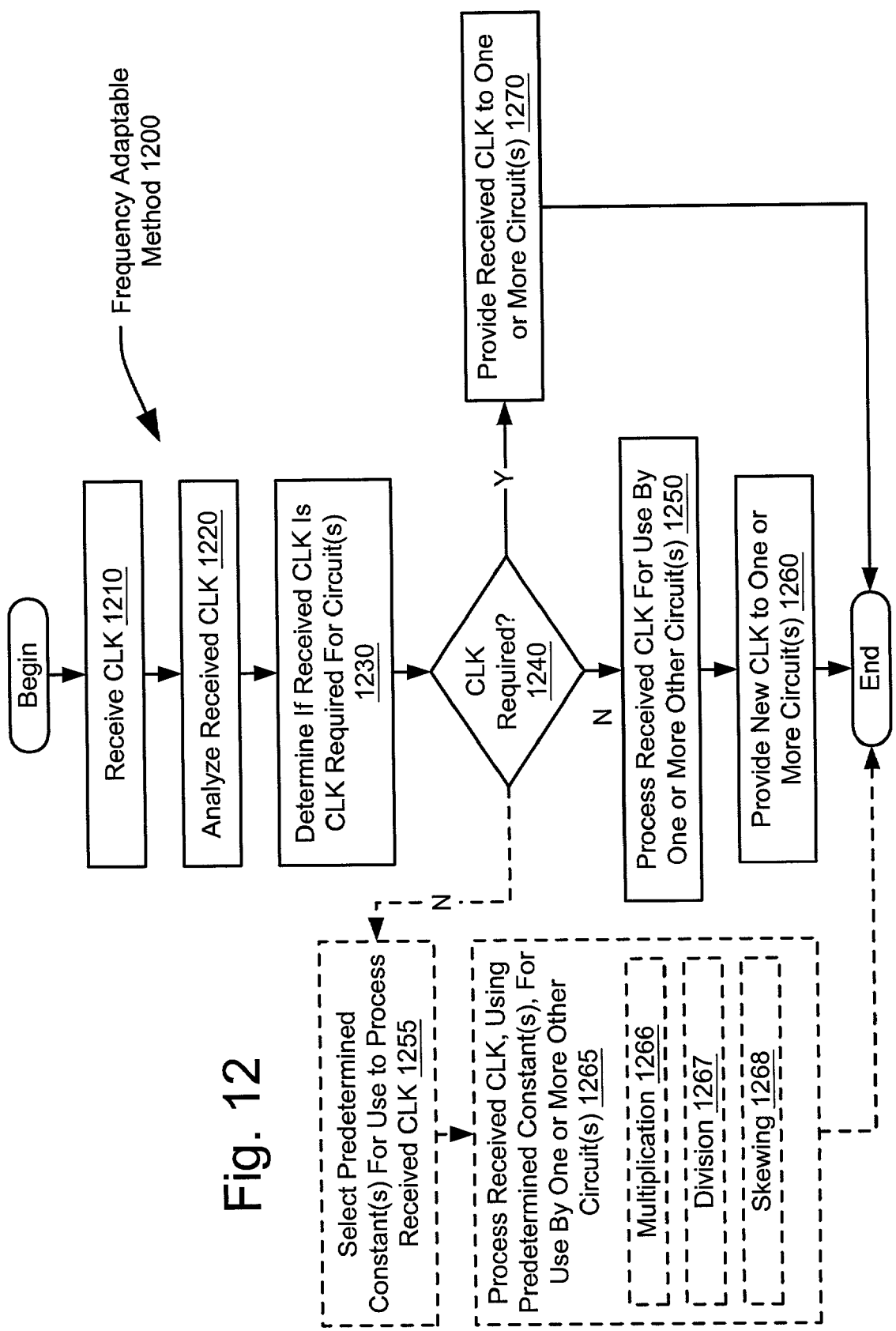
FIG. 12 is an operational flow diagram illustrating another embodiment of a frequency adaptable method that is performed in accordance with certain aspects of the present invention.

FIG. 12 is an operational flow diagram illustrating another embodiment of a frequency adaptable method 1200 that is performed in accordance with certain aspects of the present invention. A CLK is received in a block 1210. Then, the CLK is analyzed in a block 1220. In a block 1230, it is determined whether the received CLK is the CLK that is required for use by one or more circuits within a system. In a decision block 1240, if it is determined that the CLK is in fact a required CLK, then the received CLK is provided to the one or more circuits as shown in a block 1270. The received CLK may be viewed as being passed onto the one or more circuits in the block 1270.

Alternatively, in the decision block 1240, if it is determined that the CLK is not a required CLK, then the received CLK is processed in a block 1250 to transform the received CLK into one or more new CLKs that is/are suitable for use by one of more circuits within the system. Then, the one or more new CLKs that is/are suitable for use by one of more circuits within the system is actually provided to the one of more circuits within the system as shown in a block 1260.

In alternative embodiments, in the decision block 1240, if it is determined that the CLK is not a required CLK, then at least one predetermined constant is selected for use to process the received CLK in a block 1255. This selection may be based on the knowledge that is extracted via analysis of the received CLK in the block 1220. Then, in a block 1265, the received CLK is processed, using the one or more predetermined constants to transform the received CLK into a new CLK that is suitable for use by one of more circuits within a system. The processing may include performing multiplication (as shown in a block 1266), division (as shown in a block 1267), and skewing (as shown in a block 1268).

Figure 13:
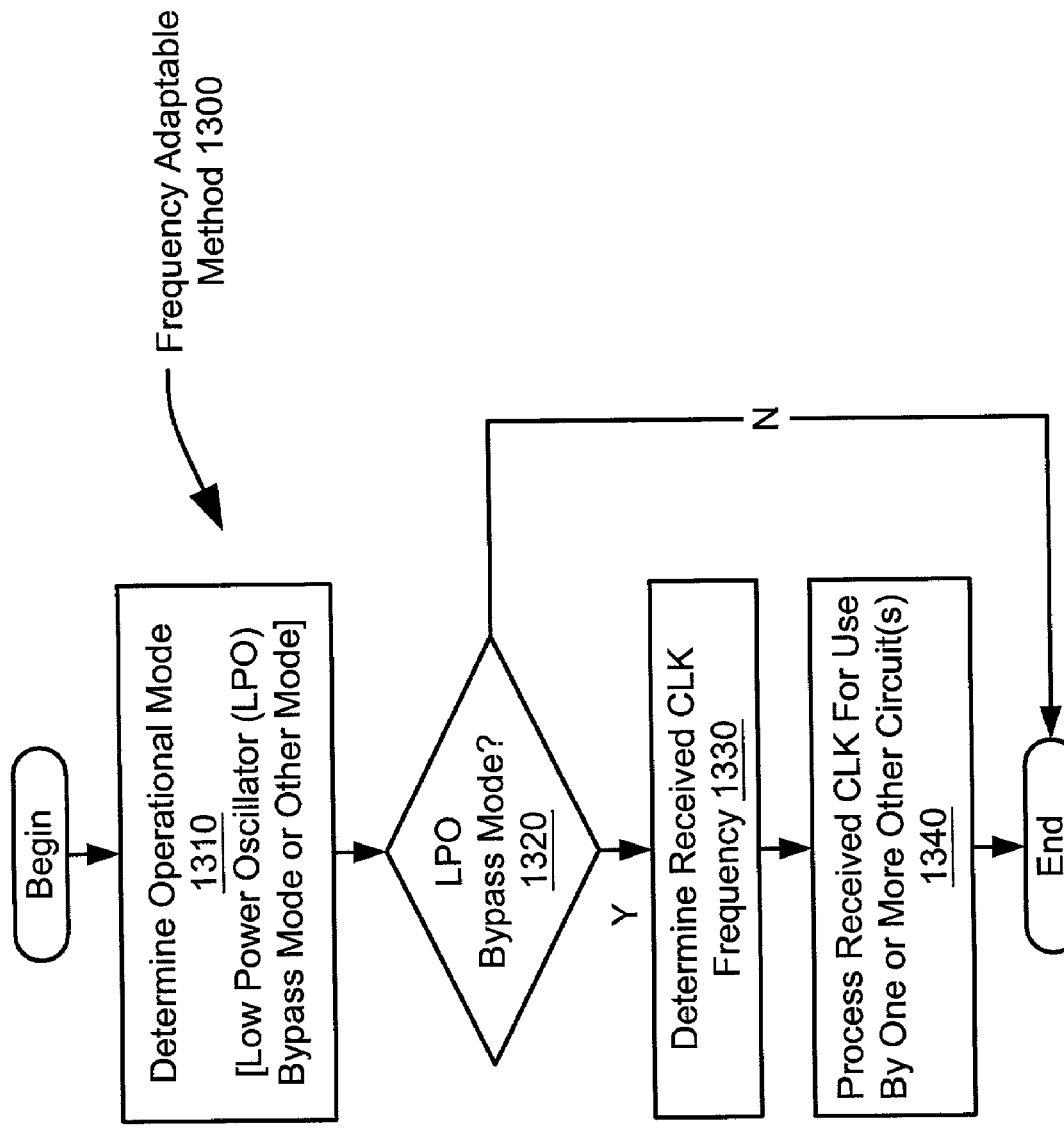
FIG. 13 is an operational flow diagram illustrating another embodiment of a frequency adaptable method that is performed in accordance with certain aspects of the present invention.

FIG. 13 is an operational flow diagram illustrating another embodiment of a frequency adaptable method 1300 that is performed in accordance with certain aspects of the present invention. In a block 1310, the operational mode that is used within a system is determined. The operational mode may be a low power oscillator (LPO) bypass mode or some other operational mode. Then, in a decision block 1320, it is determined whether the operational mode is the LPO bypass mode. If it is not, then the method terminates.

However, if it is determined that the operational mode is the LPO bypass mode, then the received CLK frequency is determined in a block 1330. Using this determined information regarding the received CLK frequency and also using information regarding the various circuitries within a system, the received CLK is processed to transform the received CLK into a new CLK that is suitable for use by one of more circuits within the system as shown in a block 1340.

Figure 14:
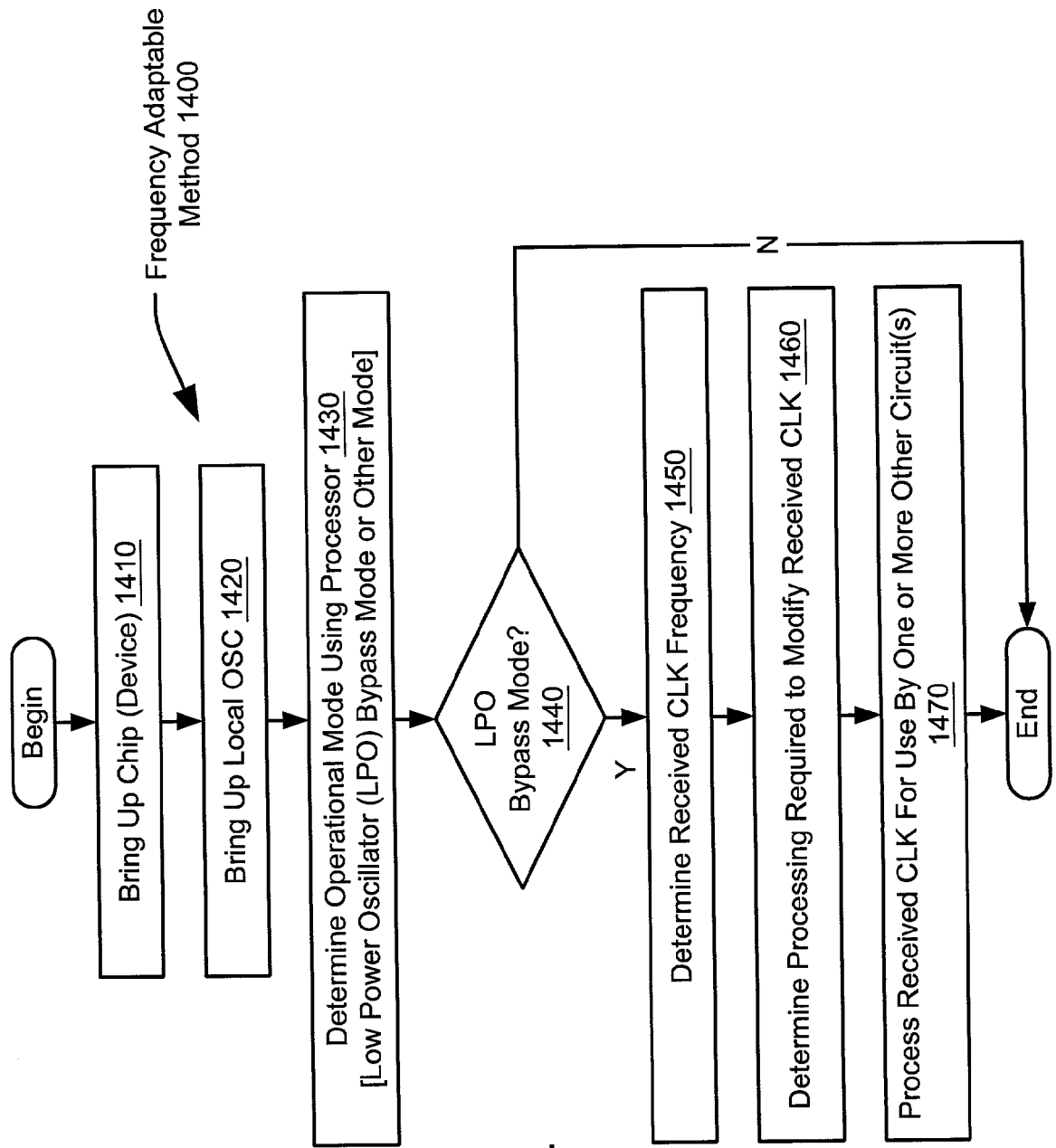
FIG. 14 is an operational flow diagram illustrating another embodiment of a frequency adaptable method that is performed in accordance with certain aspects of the present invention.

FIG. 14 is an operational flow diagram illustrating another embodiment of a frequency adaptable method 1400 that is performed in accordance with certain aspects of the present invention. In a block 1410, a device (chip) is brought up. This may be viewed as being the initialization/start-up/booting of the device in the block 1410. A local oscillator (which may be a local internal, low powered oscillator (LPO) in certain embodiments) is then brought up as shown in a block 1420.

In a block 1430, the operational mode that is used within a system is determined. The operational mode may be a low power oscillator (LPO) bypass mode or some other operational mode. Then, in a decision block 1440, it is determined whether the operational mode is the LPO bypass mode. If it is not, then the method terminates.

However, if it is determined that the operational mode is the LPO bypass mode, then the received CLK frequency is determined in a block 1450. Using this determined information regarding the received CLK frequency and also using information regarding the various circuitries within a system, then in a block 1460, the appropriate processing is determined to transform the received CLK into a new CLK that is suitable for use by one of more circuits within the system. Ultimately, in a block 1470, the actual processing of the received CLK is performed to transform the received CLK into a new CLK that is suitable for use by one of more circuits within the system. This processing in the block 1470 is performed by using the identified processing parameters that are determined in the block 1460.

Figure 15:
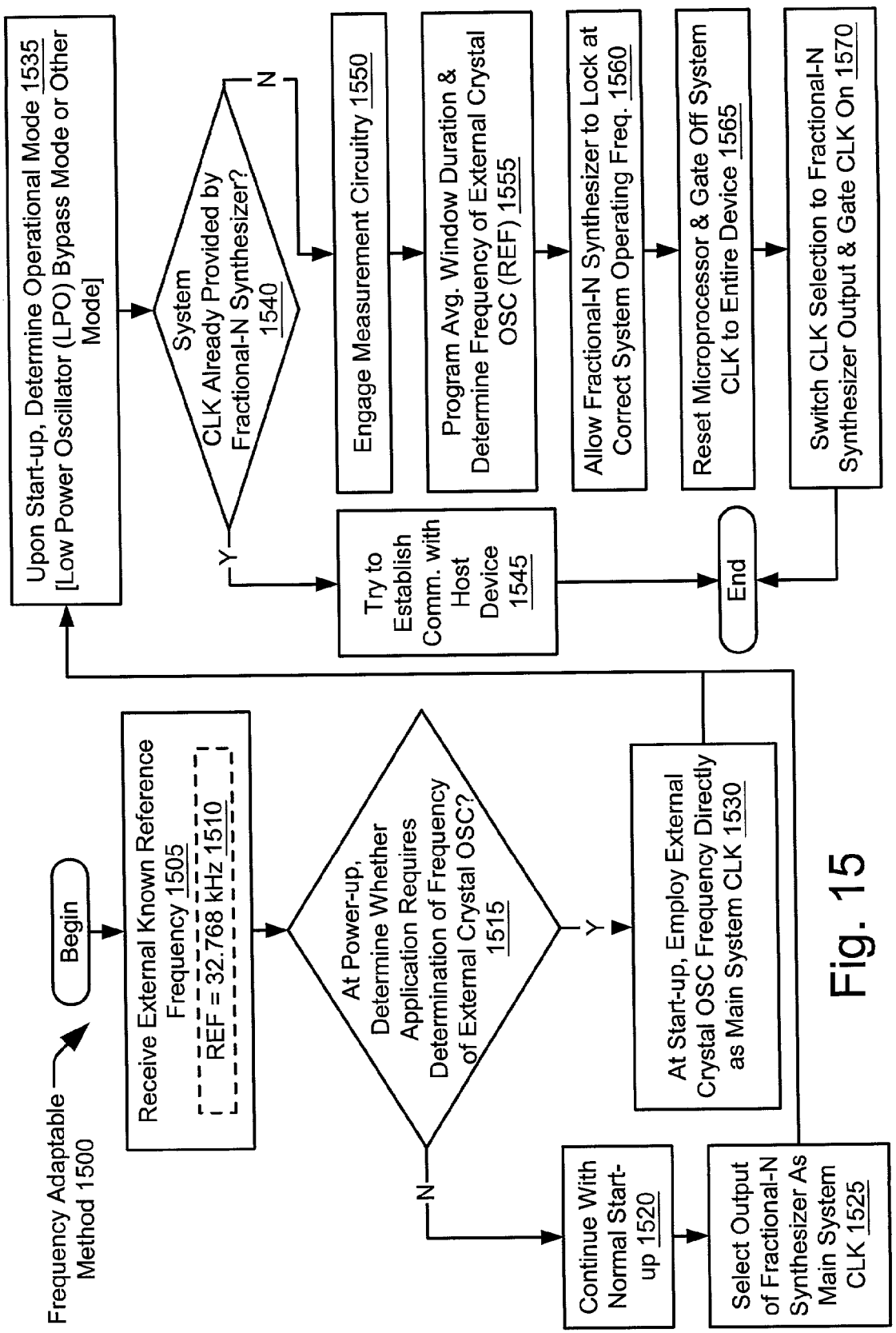
FIG. 15 is an operational flow diagram illustrating another embodiment of a frequency adaptable method that is performed in accordance with certain aspects of the present invention.

FIG. 15 is an operational flow diagram illustrating another embodiment of a frequency adaptable method 1500 that is performed in accordance with certain aspects of the present invention. As mentioned above, the present invention provides for a solution that requires a device to receive an external known reference. This external known reference is received in a block 1505. The external known reference has a frequency that is substantially 32.768 kHz in certain embodiments. This reference is employed because of its prevalence in low-power devices. The allowable frequency error of the reference is a function the minimum difference between chosen crystal frequencies and the error in the chosen crystal oscillator. Based on a number of pre-selected frequencies, an allowable frequency error of +/−3000 parts per million (PPM) is tolerable without generating any deleterious effects.

As shown in a decision block 1515, at power-up, the device determines, through decode of external mode select pins, whether it is in an application where it must determine the frequency of an external crystal oscillator. If not, the processor is allowed to start-up normally as shown in a block 1520. The system allows the output of a fractional-N synthesizer to remain selected as the main system clock as shown in a block 1525.

If the crystal frequency requires measurement as determined in the decision block 1515, the processor is allowed to start with the crystal frequency used directly as the system clock as shown in a block 1530. In either of the above cases, upon start-up, the processor can then determine its operational mode as shown in a block 1535. Then, as determined in a decision block 1540, if the system clock is already provided by the fractional-N synthesizer, then the processor can immediately begin trying to establish communication with a host device as shown in a block 1545.

Otherwise, the method engages a measurement circuit as shown in a block 1550. The measurement circuit is operable and designed to fulfill at least two different functions. One of the functions is to compare an oscillator frequency with an external reference for the purpose of selecting the correct fractional-N synthesizer programming values. One other function is to measure the frequency of an internally generated low-power oscillator (LPO) using the external oscillator frequency as a reference. The circuit need not perform both of these functions simultaneously.

For proper engagement of the measurement circuitry, the processor first programs an averaging window duration over which the frequency of the external crystal oscillator is determined as shown in a block 1555. The description below is employed to perform proper external crystal oscillator determination. A window size of 20 is used as this provides a balance between time needed to complete the measurement and overall measurement accuracy. A window size of 20 tells the measurement circuit to count 20 of the low frequency clock rising edges while at the same time counting the number of rising edges on the high frequency clock. As the output of the high-frequency counter rises, its value is compared to predetermined counts for selected oscillator frequencies.

A table below shows the ranges of the counter output that will select each of a pre-chosen number of oscillators. The range assumes that the high frequency clock is divided by 12 before reaching the clock counter. Using $1/12^{th}$ of the system clock frequency does not significantly reduce accuracy, and it also limits the number of bits required in the counter and the associated registers.

| Clocks (MHz) | Count (on time) | Count (120 ppm fast) | Count (120 ppm slow) | Min Range | Max Range |
|---|---|---|---|---|---|
| 26 | 1322 | 1322 | 1322 | 1165 | 1350 |
| 19.8 | 1007 | 1006 | 1007 | 1004 | 1164 |
| 19.68 | 1000 | 1000 | 1001 | 988 | 1003 |
| 19.2 | 976 | 976 | 976 | 915 | 987 |
| 16.8 | 854 | 854 | 854 | 818 | 914 |
| 15.36 | 781 | 781 | 781 | 757 | 817 |
| 14.4 | 732 | 732 | 732 | 697 | 756 |
| 13 | 661 | 661 | 661 | 636 | 696 |
| 12 | 610 | 610 | 610 | 500 | 635 |
| 7.68 | 390 | 390 | 390 | 380 | 499 |

When the high-frequency counter value is greater than or equal to the min range value or less than or equal to the max range value, the associated oscillator is selected. If the counter value is below the lowest min value or above the highest max value, the measurement is declared invalid and the selection defaults to the strapped setting. When the selection process is complete, 20 cycles of the 32.768 kHz clock are counted out to allow the fractional-N synthesizer sufficient time (600 μsecs) to lock at the correct system operating frequency as shown in a block 1560. Other time periods may be employed when using reference signals of different frequency. The specific number of 20 cycles is employed in one embodiment of the present invention. Those persons having skill in the art will appreciate that the total number of cycles may vary in various embodiments as well.

After a reset signal is then applied to the embedded microprocessor (from a state machine), the system clock is gated off to the entire chip as shown in a block 1565. immediately thereafter, the clock selection is changed to select the output of the fractional-N synthesizer, and the clock is gated on as shown in a block 1570. Each of these steps is performed in order at a different 32.768 kHz clock epoch. This operation prevents any glitches on the clock caused by the fractional-N synthesizer or by the clock gating circuit from propagating to any sequential elements in the chip (or device).

Figure 16:
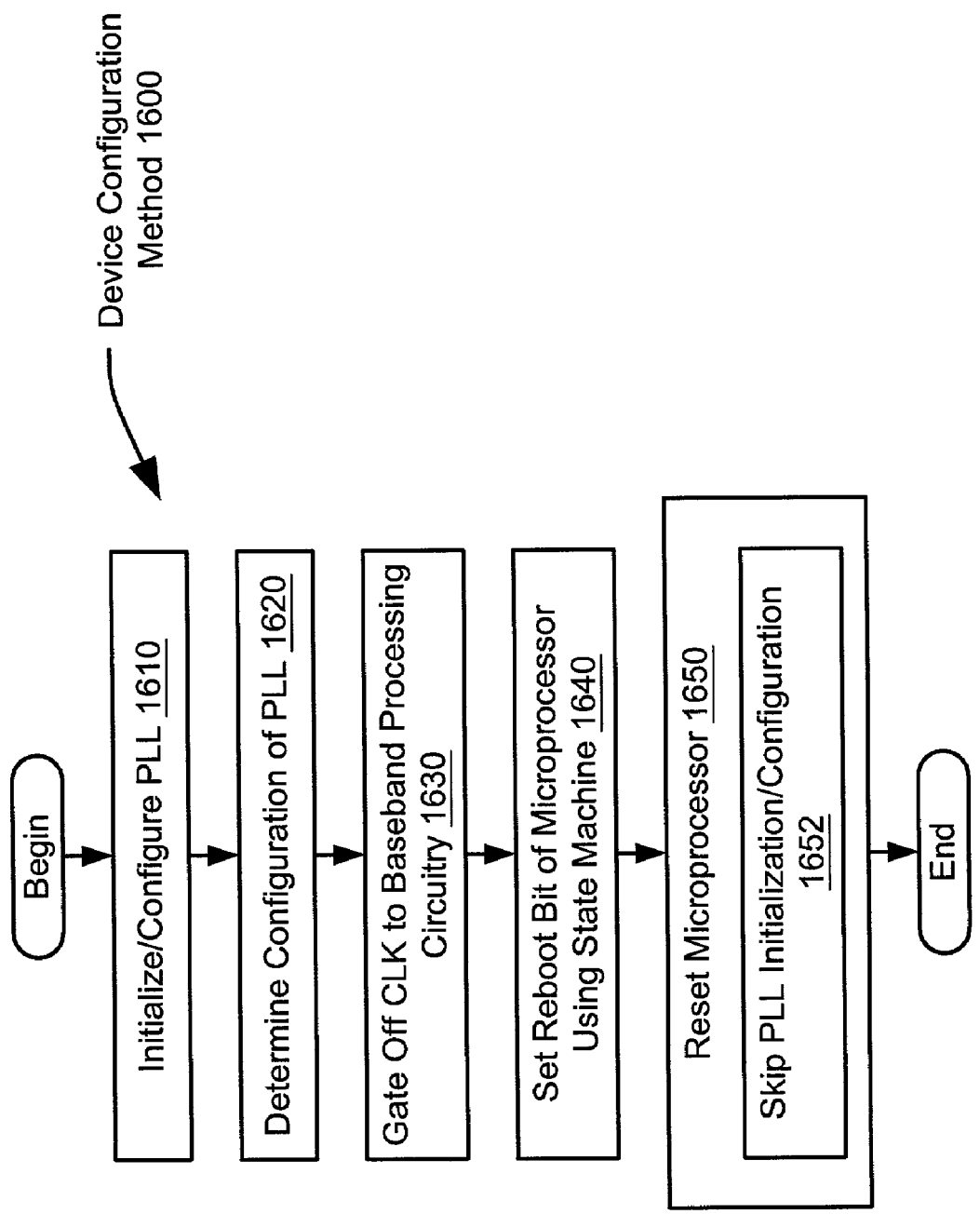
FIG. 16 is an operational flow diagram illustrating an embodiment of a device configuration method that is performed in accordance with certain aspects of the present invention.

FIG. 16 is an operational flow diagram illustrating an embodiment of a device configuration method 1600 that is performed in accordance with certain aspects of the present invention. In a block 1610, a phase locked loop (PLL) is initialized/configured. Then, in a block 1620, the configuration of the PLL is determined. Afterwards, the CLK that is initially provided to a baseband processing circuitry is gated off in a block 1630.

In a block 1640, a reboot bit of a microprocessor is set using a state machine. Then, the microprocessor is actually reset in a block 1650. Then, in a block 1652, during this reset of the microprocessor, the method skips the PLL initialization/configuration based on the signal provided by an external reference.

Figure 17:
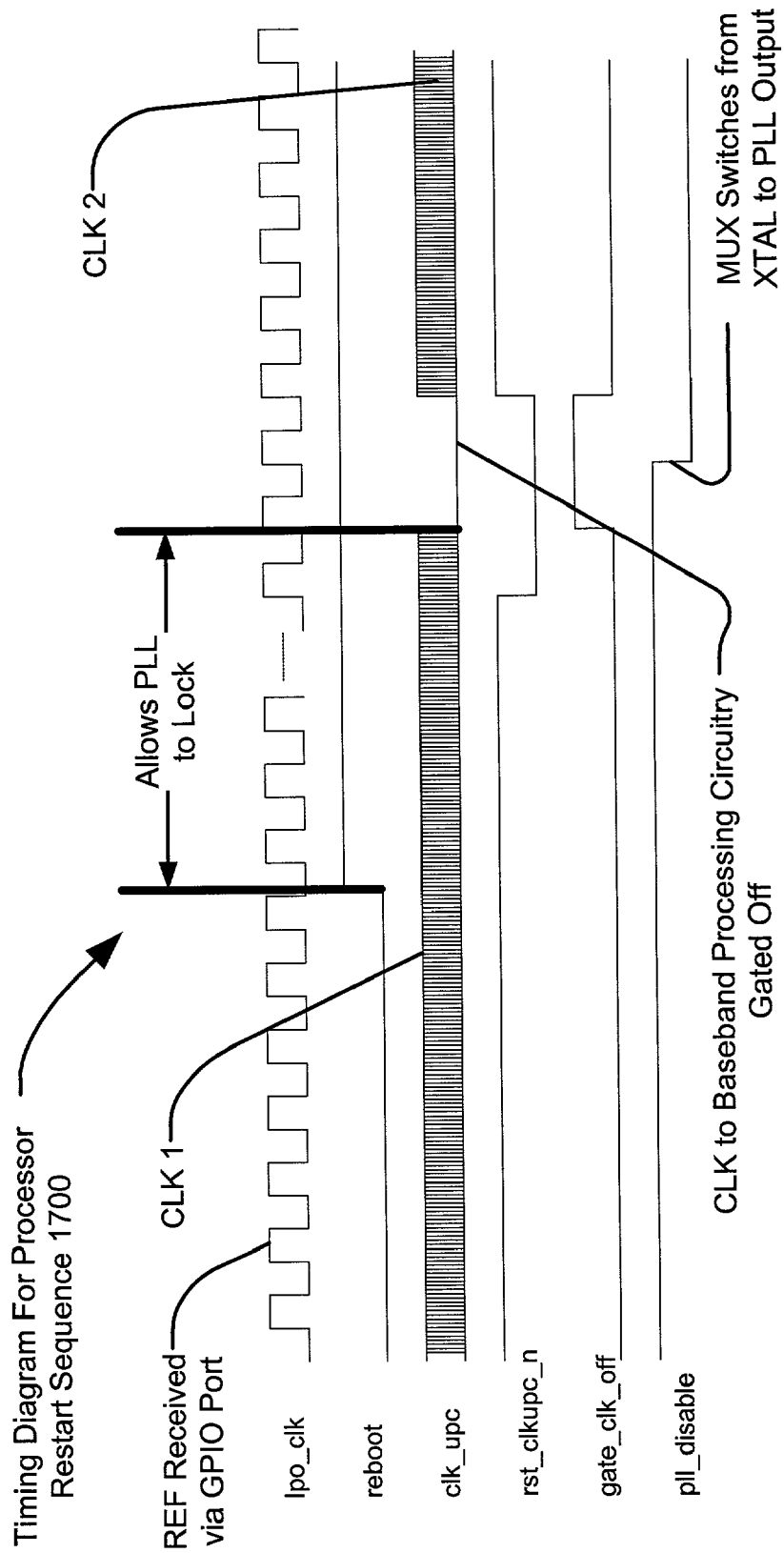
FIG. 17 is a timing diagram illustrating an embodiment of a restart sequence performed by a processor that is built in accordance with certain aspects of the present invention.

FIG. 17 is a timing diagram illustrating an embodiment of a restart sequence 1700 performed by a processor that is built in accordance with certain aspects of the present invention.

The top of the restart sequence 1700 shows a CLK signal generated by a low power oscillator (LPO), shown as lpo_clk. This is a reference signal received via a general purpose input/output (GPIO) interface port. The frequency of this signal is substantially 32.768 kHz in certain embodiments.

Continuing downward, in the next timing signal of the restart sequence 1700, a rising edge of a reboot signal (reboot) initiates the rebooting of a microprocessor in accordance with the present invention. Immediately below the reboot signal is the microprocessor CLK signal (clk_upc); below the microprocessor CLK signal (clk_upc) is a reset signal to the microprocessor (rst_clkupc_n); below this signal is a gate clock off signal (gate_clk_off); below this signal is a phase locked loop (PLL) disable signal (pll_disable).

The microprocessor first received a first clock signal (CLK1). After the reboot signal rises, then the PLL is provided with a period over which to lock onto the proper frequency. During this period, the clock signal (CLK1) that is provided to the microprocessor (within a baseband processing circuitry) is gated off. This period may also be viewed as being the time period over which a fractional-N synthesizer may lock at the correct system operating frequency.

After this period has elapsed and the PLL has locked, then the PLL is disabled so that it may skip the initialization/configuration start-up sequence when the microprocessor is reset. Again, the gate clock signal (gate_clk_off) gates off the CLK1 that is provided to the microprocessor (within a baseband processing circuitry) until the appropriate clock signal is then identified, generated, and provided to the microprocessor; this second and appropriate clock signal is shown as a second clock signal (CLK2).

During this period in which the gate actually gates off the signal CLK1 that is provided to the microprocessor (within the baseband processing circuitry), then a MUX is able then to switch from the signal XTAL to the actual output of the PLL and may properly provide the appropriate clock signal CLK2 to the microprocessor (within a baseband processing circuitry). This output may be viewed as also including any necessary mathematical processing on the signal (including any necessary multiplication, division, and skewing) that should be performed on the output of the PLL to transform the signal into a new signal that is suitable for use by one of more circuits within the system.

In view of the above detailed description of the invention and associated drawings, other modifications and variations will now become apparent to those skilled in the art. It should also be apparent that such other modifications and variations may be effected without departing from the spirit and scope of the invention.

What is claimed is:

1. A frequency adaptable semiconductor device, comprising:
   a clock measurement and processing circuitry;
   a radio frequency circuitry, communicatively coupled to the clock measurement and processing circuitry, that operates using a first clock signal; and
   a baseband processing circuitry, communicatively coupled to the clock measurement and processing circuitry, that operates using a second clock signal; and
   wherein the clock measurement and processing circuitry is operable to receive a clock signal;
   the clock measurement and processing circuitry determines whether the frequency of the received clock signal comprises at least one of a frequency of the first clock signal and a frequency of the second clock signal; and
   the clock measurement and processing circuitry is operable to transform the frequency of the received clock signal to at least one of the frequency of the first clock signal and the frequency of the second clock signal when the frequency of the received clock signal fails to comprise at least one of the frequency of the first clock signal and the frequency of the second clock signal.

2. The frequency adaptable semiconductor device of claim 1, wherein the clock measurement and processing circuitry further comprises a measurement circuitry and a fractional-N synthesizer;
   the measurement circuitry is operable to measure the frequency of the received clock signal;
   the fractional-N synthesizer is operable to perform mathematical processing to transform the received clock signal substantially into at least one of the first clock signal and the second clock signal.

3. The frequency adaptable semiconductor device of claim 2, wherein the fractional-N synthesizer is operable to perform mathematical processing that comprises at least one of multiplication, division, and skewing of the received clock signal.

4. The frequency adaptable semiconductor device of claim 3, wherein the at least one of the multiplication and the division further comprises employing a selected at least one constant; and
   the selected at least one constant being selected from among a plurality of available constants while considering the frequency of the received clock signal and the at least one of the frequency of the first clock signal and the frequency of the second clock signal.

5. The frequency adaptable semiconductor device of claim 1, wherein the clock measurement and processing circuitry further comprises a measurement circuitry;
   the measurement circuitry further comprises a comparison circuitry and a microprocessor circuitry; and
   the comparison circuitry being communicatively coupled to the microprocessor circuitry.

6. The frequency adaptable semiconductor device of claim 1, wherein the clock measurement and processing circuitry further comprises a fractional-N synthesizer;

the fractional-N synthesizer further comprises a phase locked loop, a divider, a multiplexor, and a gate;

the phase locked loop being communicatively coupled to the divider;

the divider being communicatively coupled to the multiplexor; and the multiplexor being communicatively coupled to the gate.

7. The frequency adaptable semiconductor device of claim 1, wherein the clock measurement and processing circuitry is operable to receive the clock signal from a known external reference clock signal.

8. The frequency adaptable semiconductor device of claim 7, wherein the frequency of the received clock signal comprises approximately 32.768 kHz.

9. The frequency adaptable semiconductor device of claim 1, further comprising a low power oscillator, communicatively coupled to the clock measurement and processing circuitry; and wherein the clock measurement and processing circuitry is operable to receive the clock signal from the low power oscillator.

10. The frequency adaptable semiconductor device of claim 1, wherein the baseband processing circuitry initially employs the received clock signal as a main system clock; and the baseband processing circuitry subsequently switches from the received clock signal to the second clock signal, thereafter using the second clock signal as the main system clock.

11. A semiconductor device, comprising:

a baseband processing circuitry that is operable to characterize a frequency of a received clock signal;

a fractional-N synthesizer that is operable to generate an output clock signal having one frequency selected from among a plurality of frequencies, the selected frequency being within the fractional-N synthesizer selected using a feedback programming value;

wherein the baseband processing circuitry initially employs the received clock signal as a baseband processing circuitry main system clock when determining the feedback programming value;

the baseband processing circuitry feeds back the feedback programming value to the fractional-N synthesizer; and the baseband processing circuitry subsequently operates using the output clock signal, from the fractional-N synthesizer, as the baseband processing circuitry main system clock.

12. The semiconductor device of claim 11, wherein the baseband processing circuitry further comprises a measurement circuitry;

the measurement circuitry characterizes the frequency of the received clock signal by comparing the received clock signal to a known external reference clock signal.

13. The semiconductor device of claim 12, wherein the frequency of the received clock signal comprises approximately 32.768 kHz.

14. The semiconductor device of claim 12, wherein the baseband processing circuitry further comprises a microprocessor circuitry;

the microprocessor circuitry is reset after the measurement circuitry characterizes the frequency of the received clock signal;

the baseband processing circuitry switches from employing the received clock signal as the baseband processing circuitry main system clock to employing the output clock signal, provided by the fractional-N synthesizer, as the baseband processing circuitry main system clock during the re-setting of the microprocessor circuitry.

15. The semiconductor device of claim 14, wherein the baseband processing circuitry further comprises a state machine, the microprocessor circuitry and the state machine being communicatively coupled; and the state machine sets a reboot bit of the microprocessor circuitry thereby initiating the reset of the microprocessor circuitry.

16. The semiconductor device of claim 11, further comprising a radio frequency circuitry, communicatively coupled to the fractional-N synthesizer, that employs the received clock signal as a radio frequency circuitry main system clock.

17. The semiconductor device of claim 16, wherein a frequency of the radio frequency circuitry main system clock comprises approximately 192 MHz; and a frequency of the baseband processing circuitry main system clock comprises approximately 48 MHz.

18. The semiconductor device of claim 11, wherein the baseband processing circuitry further comprises a measurement circuitry;

the measurement circuitry further comprises a comparison circuitry and a microprocessor circuitry; and the comparison circuitry being communicatively coupled to the microprocessor circuitry.

19. The semiconductor device of claim 11, wherein the fractional-N synthesizer further comprises a phase locked loop, a divider, a multiplexor, and a gate;

the phase locked loop being communicatively coupled to the divider;

the divider being communicatively coupled to the multiplexor; and the multiplexor being communicatively coupled to the gate.

20. The semiconductor device of claim 11, wherein the baseband processing circuitry further comprises a microprocessor circuitry; and the microprocessor circuitry determines whether an operational mode of the semiconductor device comprises a low power oscillator bypass mode.

21. A semiconductor device, comprising:

a baseband processing circuitry;

a fractional-N synthesizer, communicatively coupled to the baseband processing circuitry, that is operable to generate an output clock signal having one frequency selected from among a plurality of frequencies, the selected frequency being within the fractional-N synthesizer selected using a feedback programming value; and wherein the baseband processing circuitry further comprises a measurement circuitry and a state machine, the measurement circuitry and the state machine being communicatively coupled;

the measurement circuitry further comprises a comparison circuitry and a microprocessor circuitry, the comparison circuitry and the microprocessor circuitry being communicatively coupled, the measurement circuitry is operable to characterize a frequency of a received clock signal;

the fractional-N synthesizer further comprises a phase locked loop, a divider, a multiplexor, and a gate;

the phase locked loop being communicatively coupled to the divider;

the divider being communicatively coupled to the multiplexor;

the multiplexor being communicatively coupled to the gate;

the baseband processing circuitry initially employs the received clock signal as a baseband processing circuitry main system clock when determining the feedback programming value;

at least one of the microprocessor circuitry and the state machine determines the feedback programming value and the baseband processing circuitry feeds back the feedback programming value to at least one of the phase locked loop, the multiplexor, and the gate of the fractional-N synthesizer; and the baseband processing circuitry subsequently operates using the output clock signal, from the fractional-N synthesizer, as the baseband processing circuitry main system clock.

22. The semiconductor device of claim 21, wherein the state machine generates the feedback programming value, the feedback programming value comprising a multiplexor select feedback signal that determines which input, selected from at least two inputs provided to the multiplexor, is to be selected as an output of the multiplexor.

23. The semiconductor device of claim 21, wherein the state machine generates the feedback programming value, the feedback programming value comprising a gate control feedback signal.

24. The semiconductor device of claim 21, wherein the microprocessor circuitry generates the feedback programming value, the feedback programming value comprising a phase locked loop control feedback signal.

25. The semiconductor device of claim 21, further comprising a radio frequency circuitry, communicatively coupled to the fractional-N synthesizer, that receives at least one additional output clock signal having one frequency selected from among the plurality of frequencies; and the radio frequency circuitry employs the at least one additional output clock signal as a radio frequency circuitry main system clock.

26. The semiconductor device of claim 25, wherein a frequency of the radio frequency circuitry main system clock approximately comprises 192 MHz; and a frequency of the baseband processing circuitry main system clock comprises approximately 48 MHz.

27. The semiconductor device of claim 21, wherein the microprocessor circuitry is reset after the measurement circuitry characterizes the frequency of the received clock signal;

the baseband processing circuitry switches from employing the received clock signal as the baseband processing circuitry main system clock to employing the output clock signal, provided by from the fractional-N synthesizer, as the baseband processing circuitry main system clock during the re-setting of the microprocessor circuitry.

28. The semiconductor device of claim 27, wherein the state machine sets a reboot bit of the microprocessor circuitry thereby initiating the reset of the microprocessor circuitry.

29. The semiconductor device of claim 21, wherein measurement circuitry characterizes the frequency of the received clock signal by comparing the received clock signal to a known external reference clock signal; and the frequency of the known external reference clock signal comprises approximately 32.768 kHz.

30. The semiconductor device of claim 21, wherein the microprocessor circuitry determines whether an operational mode of the semiconductor device comprises a low power oscillator bypass mode.

31. A frequency adaptable method, comprising:

receiving a clock signal;

measuring a frequency of the received clock signal;

determining whether the frequency of the received clock signal comprises a frequency that is suitable for use as a baseband processing circuitry main system clock by a baseband processing circuitry;

determining whether the frequency of the received clock signal comprises a frequency that is suitable for use as a radio frequency circuitry main system clock by a radio frequency circuitry;

processing the received clock signal, when the received clock signal is not suitable for use as the baseband processing circuitry main system clock, to generate a new clock signal that comprises a frequency that is suitable for use as the baseband processing circuitry main system clock; and processing the received clock signal, when the received clock signal is not suitable for use as the radio frequency circuitry main system clock, to generate at least one additional new clock signal that comprises a frequency that is suitable for use as the radio frequency circuitry main system clock.

32. The method of claim 31, further comprising providing the new clock signal to the baseband processing circuitry.

33. The method of claim 32, further comprising generating the clock signal using an internal, low power oscillator; and wherein the semiconductor device comprises the internal, low power oscillator.

34. The method of claim 31, further comprising providing the at least one additional new clock signal to the radio frequency circuitry.

35. The method of claim 31, wherein the received clock signal is derived from a known external reference clock signal.

36. The method of claim 31, wherein the frequency of the received clock signal substantially comprises approximately 32.768 kHz.

37. The method of claim 31, wherein the frequency of the radio frequency circuitry main system clock comprises approximately 192 MHz; and the frequency of the baseband processing circuitry main system clock comprises approximately 48 MHz.

38. The method of claim 31, wherein the radio frequency circuitry and the baseband processing circuitry are contained within a semiconductor device; and further comprising determining whether an operational mode of the semiconductor device comprises a low power oscillator bypass mode.

39. The method of claim 31, wherein the processing of the received clock signal comprises performing at least one of multiplication, division, and skewing to transform the received clock signal into at least one of the new clock signal and the at least one additional new clock signal.

40. The method of claim 31, further comprising initially providing the received clock signal to the baseband processing circuitry; and subsequently providing the new clock signal to the baseband processing circuitry.

41. A frequency adaptable method, comprising:
  determining whether an operational mode of a semiconductor device comprises a low power oscillator bypass mode;
  generating a clock signal using a low power oscillator when the operational mode comprises the low power oscillator bypass mode, the semiconductor device comprising the low power oscillator, a baseband processing circuitry, and a radio frequency circuitry;
  receiving a clock signal from an external source when the operational mode fails to comprise the low power oscillator bypass mode;
  measuring a frequency of at least one of the generated clock signal and the received clock signal;
  determining whether the frequency of at least one of the generated clock signal and the received clock signal comprises a frequency that is suitable for use as a baseband processing circuitry main system clock by the baseband processing circuitry;
  determining whether the frequency of at least one of the generated clock signal and the received clock signal comprises a frequency that is suitable for use as a radio frequency circuitry main system clock by the radio frequency circuitry;
  processing at least one of the generated clock signal and the received clock signal, when at least one of the generated clock signals and the received clock signal is not suitable for use as the baseband processing circuitry main system clock, to generate a new clock signal that comprises a frequency that is suitable for use as the baseband processing circuitry main system clock; and
  processing at least one of the generated clock signals and the received clock signal, when at least one of the generated clock signals and the received clock signal is not suitable for use as the radio frequency circuitry main system clock, to generate at least one additional new clock signal that comprises a frequency that is suitable for use as the radio frequency circuitry main system clock.

42. The method of claim 41, wherein the frequency of the received clock signal comprises approximately 32.768 kHz.

43. The method of claim 41, wherein the frequency of the radio frequency circuitry main system clock comprises approximately 192 MHz; and
  the frequency of the baseband processing circuitry main system clock comprises approximately 48 MHz.

44. The method of claim 41, wherein the baseband processing circuitry further comprises a microprocessor circuitry; and
  further comprising initially providing the received clock signal to the baseband processing circuitry;
  re-booting the microprocessor circuitry; and
  subsequently providing the new clock signal to the baseband processing circuitry.

45. The method of claim 41, wherein the processing of at least one of the generated clock signal and the received clock signal comprises performing at least one of multiplication, division, and skewing to transform the received clock signal into at least one of the new clock signal and the at least one additional new clock signal.

46. A frequency adaptable method, comprising:
  starting up a semiconductor device;
  starting up an external oscillator, the external oscillator being communicatively coupled to the semiconductor device;
  providing an output signal from the external oscillator to the semiconductor device;
  determining an operational mode of the semiconductor device;
  determining a frequency of the output signal from the external oscillator when the operational mode of the semiconductor device substantially comprises a low power oscillator bypass mode;
  determining whether the frequency of the output signal from the external oscillator comprises a frequency that is suitable for use as a main system clock by at least one circuitry portion within the semiconductor device; and
  processing the output signal, from the external oscillator, to generate a new clock signal that comprises a frequency that is suitable for use as the main system clock.

47. The method of claim 46, wherein the at least one circuitry portion within the semiconductor device comprises at least one of a baseband processing circuitry and a radio frequency circuitry.

48. The method of claim 47, wherein the frequency of the radio frequency circuitry main system clock substantially comprises approximately 192 MHz; and
  the frequency of the baseband processing circuitry main system clock substantially comprises approximately 48 MHz.

49. The method of claim 46, wherein the frequency of the output signal from the external reference oscillator comprises approximately 32.768 kHz.

50. The method of claim 46, wherein the processing of the output signal, from the external oscillator, performing at least one of multiplication, division, and skewing to transform the output signal into the new clock signal.

51. A frequency adaptable method employed within a semiconductor device, comprising:
  receiving a clock signal from an external crystal oscillator;
  during power-up, determining whether at least one circuitry portion within the semiconductor device employs an application that requires determination of a frequency of the received clock signal;
  initially employing the clock signal as a main system clock within the semiconductor device;
  determining whether a fractional-N synthesizer, contained within the semiconductor device, initially provides the main system clock;
  measuring the clock signal that is received from the external crystal oscillator;
  allowing a phase locked loop, contained within the fractional-N synthesizer, to lock at a system operating frequency;
  resetting a microprocessor circuitry, contained within the semiconductor device;
  gating off the clock signal that is received from the external crystal oscillator;
  programming the fractional-N synthesizer to generate a new clock signal to be used as the system clock, the system clock having the system operating frequency; and
  switching in the new clock signal in place of the gated off clock signal, the new clock signal thereafter being used as the system clock.

52. The method of claim 51, wherein the semiconductor device comprises a radio frequency circuitry and a baseband processing circuitry.

53. The method of claim 52, further comprising operating the radio frequency circuitry by using the clock signal that is received from the external crystal oscillator as the radio frequency circuitry system clock;

initially operating the baseband processing circuitry by using the clock signal that is received from the external crystal oscillator as the baseband processing circuitry system clock; and subsequently operating the baseband processing circuitry by using the new clock signal that is generated fractional-N synthesizer as the baseband processing circuitry system clock.

54. The method of claim 53, wherein the frequency of the radio frequency circuitry main system clock comprises approximately 192 MHz; and the frequency of the baseband processing circuitry main system clock comprises approximately 48 MHz.

55. The method of claim 51, wherein a frequency of the clock signal from the external oscillator comprises approximately 32.768 kHz.

* * * * *

UNITED STATES PATENT AND TRADEMARK OFFICE
CERTIFICATE OF CORRECTION

| | |
|---|---|
| PATENT NO. | : 6,993,306 B2 |
| APPLICATION NO. | : 10/054247 |
| DATED | : January 31, 2006 |
| INVENTOR(S) | : Mitchell Buznitsky et al. |

Page 1 of 1

It is certified that error appears in the above-identified patent and that said Letters Patent is hereby corrected as shown below:

Column 18, line 43, in Claim 2: after "signal", delete "substantially"

Column 22, line 44, in Claim 36: after "signal", delete "substantially"

Column 24, line 5, in Claim 46: after "device", delete "substantially"

Column 24, line 19, in Claim 48: after "clock", delete "substantially"

Column 24, line 23, in Claim 48: after "clock", delete "substantially"

Signed and Sealed this

First Day of July, 2008

JON W. DUDAS
*Director of the United States Patent and Trademark Office*